US012782407B2

(12) United States Patent
Schmidt et al.

(10) Patent No.: US 12,782,407 B2
(45) Date of Patent: Nov. 3, 2026

(54) DETERMINING THE PHASES OF RADIO FREQUENCY FIELDS USING INTERFEROMETRIC LOOPS

(71) Applicant: Quantum Valley Ideas Laboratories, Waterloo (CA)

(72) Inventors: Matthias Schmidt, Waterloo (CA); Vijin Venu, Waterloo (CA); Stephanie M. Bohaichuk, Waterloo (CA); Harald Kübler, Eberdingen (DE); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 19/637,600

(22) Filed: Apr. 2, 2026

(65) Prior Publication Data

US 2026/0309760 A1 Oct. 8, 2026

Related U.S. Application Data

(60) Provisional application No. 63/782,411, filed on Apr. 2, 2025.

(51) Int. Cl.
*G01R 29/08* (2006.01)

(52) U.S. Cl.
CPC ..... *G01R 29/0885* (2013.01); *G01R 29/0892* (2013.01)

(58) Field of Classification Search
CPC ........................ G01R 29/0885; G01R 29/0892
(Continued)

(56) References Cited

U.S. PATENT DOCUMENTS 6,762,869 B2 7/2004 Maleki et al.
10,509,065 B1 12/2019 Shaffer
(Continued)

FOREIGN PATENT DOCUMENTS

CA 3147485 1/2021
CA 3154034 4/2021
(Continued)

OTHER PUBLICATIONS

G. Antona, M. Gozzelino, S. Micalizio, C. E. Calosso, G. A. Costanzo and F. Levi, "Frequency Noise Characterization of Diode Lasers for Vapor-Cell Clock Applications," in IEEE Transactions on Instrumentation and Measurement, vol. 71, pp. 1-8, 2022, Art No. 7007908, doi: 10.1109/TIM.2022.3216836 (Year: 2022).*
(Continued)

*Primary Examiner* — Arleen M Vazquez
*Assistant Examiner* — Robert P Alejnikov, Jr.
(74) *Attorney, Agent, or Firm* — Henry Patent Law Firm PLLC

(57) ABSTRACT

In a general aspect, a system is disclosed that includes a vapor cell configured to receive an RF signal. A vapor of the vapor cell defines an RF transition, a probe optical transition, and a set of loop optical transitions that, together with the RF transition, form a closed loop of transitions. The RF transition is driven by the RF signal. The system also includes a laser system that generates probe and loop laser signals. The probe laser signal drives the probe optical transition and produces an output optical signal from the vapor cell. The loop laser signals drive the set of loop optical transitions. A signal processing system of the system determines one or more properties of the RF signal based on a detector signal from an optical detector system. The detector signal represents the output optical signal from the vapor cell.

30 Claims, 10 Drawing Sheets

(58) Field of Classification Search
USPC .................................................. 324/97
See application file for complete search history.

(56) References Cited

U.S. PATENT DOCUMENTS

| | | | |
|---|---|---|---|
| 10,564,201 B1 | 2/2020 | Shaffer | |
| 10,605,840 B1 | 3/2020 | Amarloo et al. | |
| 10,859,981 B1 | 12/2020 | Ramirez-Serrano et al. | |
| 11,054,453 B2 | 7/2021 | Amarloo et al. | |
| 11,112,298 B2 | 9/2021 | Amarloo et al. | |
| 11,137,487 B1 | 10/2021 | Amarloo et al. | |
| 11,300,599 B1 | 4/2022 | Amarloo et al. | |
| 11,307,233 B1 | 4/2022 | Amarloo et al. | |
| 11,313,926 B1 | 4/2022 | Amarloo et al. | |
| 11,366,430 B2 | 6/2022 | Ramirez-serrano et al. | |
| 11,435,234 B1 | 9/2022 | Keaveney et al. | |
| 11,658,461 B1 | 5/2023 | Liu et al. | |
| 11,681,016 B1 | 6/2023 | Bohaichuk et al. | |
| 11,874,311 B1 | 1/2024 | Dixon et al. | |
| 11,885,904 B2 | 1/2024 | Bohaichuk et al. | |
| 11,940,374 B2 | 3/2024 | Nelson et al. | |
| 12,267,103 B2 * | 4/2025 | Burton | H04B 1/16 |
| 12,529,937 B2 | 1/2026 | Liu et al. | |
| 2019/0187198 A1 | 6/2019 | Anderson et al. | |

FOREIGN PATENT DOCUMENTS

| | | | |
|---|---|---|---|
| CA | 3157498 | 6/2021 | |
| CA | 3178752 | 12/2021 | |
| CN | 113219258 | 8/2021 | |
| CN | 120779115 | 10/2025 | |
| WO | WO-2021243260 A1 * | 12/2021 | G01R 29/0885 |

OTHER PUBLICATIONS

Anderson et al., "Optical Radio-Frequency Phase Measurement With an Internal-State Rydberg Atom Interferometer," 17 Physical Review Applied 044020 (Apr. 11, 2022) (Year: 2022).*
Adams, et al., "Rydberg atom quantum technologies", J. Phys. B: At. Mol. Opt Phys. 53, Dec. 3, 2019, 14 pgs.
Bohaichuk, et al., "A Three-Photon Rydberg Atom-Based Radio Frequency Sensing Scheme with Narrow Linewidth", arXiv:2304.07409 [physics.atom-ph] (2023), 2023, 11 pages.
Bohaichuk, et al., "The Origins of Rydberg Atom Electrometer Transient Response and its Impact on Radio Frequency Pulse Sensing", arXiv:2203.01733, Mar. 3, 2022, 21 pgs.
Buckle, et al., "Atomic Interferometers", Optica Acta: International Journal of Optics 33, 1129 (1996). https://doi.org/10.1080/713822082, 1996, 13 pages.
Dixon, Katelyn, "Rydberg atom-based Electrometry Using a Self-Heterodyne Frequency Comb Readout and Preparation Scheme", Physical Review Applied 19, 034078 (2023)., 2023, 18 Pages.
Fan, et al., "Subwavelength microwave electric-field imaging using Rydberg atoms inside atomic vapor cells", Optics Letters, vol. 39, No. 10, 3030-3033, May 15, 2014, 4 pgs.
Fan, et al., "Effect of Vapor-Cell Geometry on Rydberg-Atom-Based Measurements of Radio-Frequency Electric Fields", Physical Review Applied 4, 044015 (2015), 2015, 7 pgs.
Fan, et al., "Atom based RF electric field sensing", Journal of Physics B: Atomic, Molecular and Optical Physics 48 202001 (2015), Sep. 9, 2015, 17 pgs.
Fan, et al., "Dispersive radio frequency electrometry using Rydberg atoms in a prism-shaped atomic vapor cell", J. Phys. B: At. Mol. Opt. Phys. 49 (2016) 104004, 2016, 8 pgs.
Kumar, et al., "Atom-Based Sensing of Weak Radio Frequency Electric Fields Using Homodyne Readout", Scientific Reports 7:42981, Feb. 20, 2017, 10 pgs.
Kumar, et al., "Rydberg-atom based radio-frequency electrometry using frequency modulation spectroscopy in room temperature vapor cells", Optics Express, vol. 25, No. 8, Apr. 17, 2017, 13 pgs.
Liu, et al., "Stable, narrow-linewidth laser system with a broad frequency tunability and a fast switching time", Optics Letters 49, 399 (2024), Dec. 8, 2023, 6 pages.
Morigi, et al., "Phase-dependent interaction in a four-level atomic configuration", Phys. Rev. A 66, 053409, (2002). https://doi.org/10.1103/PhysRevA.66.053409, 2002, 9 pages.
Noaman, et al., "Rydberg-Atom Sensors in Bichromatic Radio-Frequency Fields", Phys. Rev. Applied 20, 024068., Aug. 28, 2023, 6 pages.
Noaman, et al., "Vapor Cell Characterization and Optimization for Applications in Rydberg Atom-Based Radio Frequency Sensing", Proceedings vol. 12447, Quantum Sensing, Imaging, and Precision Metrology; 124470V (2023), Mar. 8, 2023, 6 pages.
Schmidt, et al., "Rydberg-atom-based radio-frequency sensors: amplitude-regime sensing", Optics Express 27768, vol. 32 No. 16, Jul. 29, 2024, 24 pages.
Sedlacek, et al., "Atom Based Vector Microwave Electrometry Using Rubidium Rydberg Atoms in a Vapor Cell", arXiv:1304.4299v1 [physics.atom-ph], Apr. 15, 2023, 5 pages.
Sedlacek, et al., "Quantum Assisted Electrometry using Bright Atomic Resonances", arXiv:1205.4461v1 [physics.atom-ph], May 20, 2012, 15 pgs.
Shaffer, et al., "A read-out enhancement for microwave electric field sensing with Rydberg atoms", Proc. SPIE vol. 10674, Quantum Technologies 2018, 2018, 12 pgs.
Steck, Daniela. , "Cesium D Line Data", Revision 2.3.3, May 28, 2024, 31 pages.
ISA, International Search Report and Written Opinion issued in Application No. PCT/CA2026/050512 on Jun. 26, 2026, 13 pages.

* cited by examiner

DETERMINING THE PHASES OF RADIO FREQUENCY FIELDS USING INTERFEROMETRIC LOOPS

CROSS-REFERENCE TO RELATED APPLICATIONS

This application claims priority to U.S. Prov. Pat. App. No. 63/782,411, which was filed on Apr. 2, 2025 and entitled "Determining the Phases of Radio Frequency Fields Using Interferometric Loops". The disclosure of this priority application is hereby incorporated herein by reference in its entirety.

BACKGROUND

The following description relates to determining the phases of radio frequency fields using interferometric loops.

Vapor cells can be manufactured by sealing a vapor within an enclosed volume. The vapor can be used as a medium to interact with electromagnetic radiation received by the vapor cell. Beams of light generated by lasers can be directed through the vapor to probe and measure the response of the vapor to the received electromagnetic radiation. In this way, a vapor cell can be used to determine properties of the received electromagnetic radiation.

DETAILED DESCRIPTION

Figure 1:
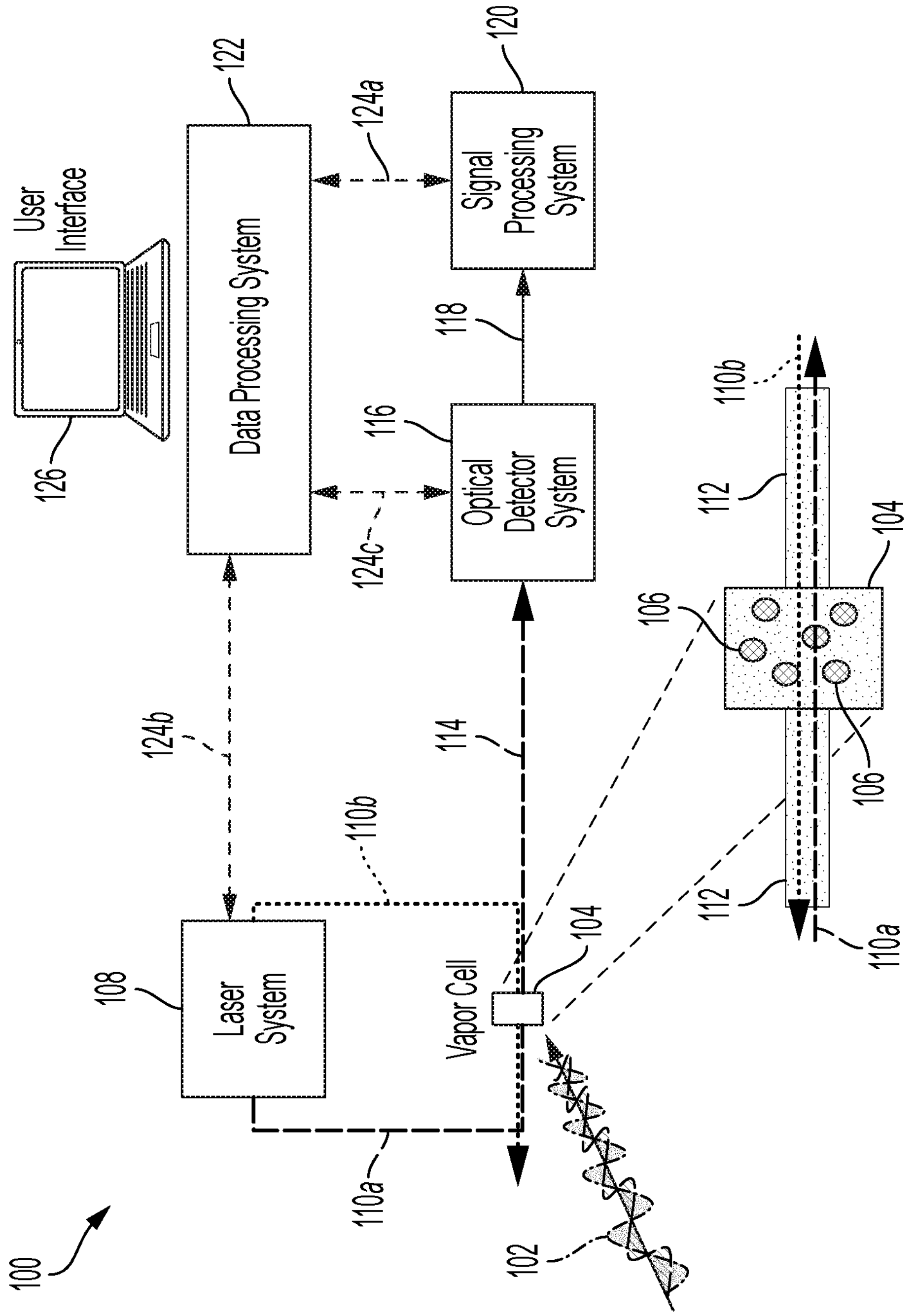
FIG. 1 is a schematic diagram of an example system for determining one or more properties of an RF signal.

In a general aspect, systems are disclosed that are configured to determine one or more properties of a radio frequency (RF) signal, such as a phase of the RF signal, an amplitude of the RF signal, a frequency of the RF signal, and so forth. The RF signal may be based on a pulsed or continuous RF field. The systems include vapor cells, such as Rydberg atom-based vapor cells, and these vapor cells may allow for detecting a phase of the RF signal all-optically and at a high data rate. In some implementations, the systems can readout amplitude and phase simultaneously at high acquisition rates, e.g., read-out I and Q data in real-time. The I data is in-phase with a reference oscillator, and the Q data is in-quadrature or 90 degrees out of phase with the reference oscillator. In many implementations, the vapor cells include a vapor that has one or more Rydberg electronic states (e.g., a vapor of Cs atoms). The vapor may allow the construction of an interferometric loop using the internal electronic structure of the atoms. The interferometric loop may function as an atomic interferometer that is sensitive to a phase, a polarization, and an amplitude of the RF signal. For example, the electronic states of the vapor—including the one or more Rydberg electronic states—can define a closed loop of transitions that includes optical transitions and an RF transition. The closed loop of transitions defines an interferometric loop when optical fields (e.g., laser signals) interact with the optical transitions and the RF signal interacts with the RF transition.

In some aspects of operation, the interferometric loop can be detuned in frequency by detuning one of the laser fields or the RF field to induce an electronic system that oscillates. The oscillations carry the phase and amplitude information of the RF signal targeted for detection and change the transmission of a probe laser signal interacting with a probe optical transition. This change causes the transmission of the probe laser signal to oscillate. Inducing an oscillation of the probe laser transmission allows the phase of the RF signal to be measured directly from the positions in time of the oscillating features, relative to a phase reference, as opposed to measuring an amplitude alone. A laser frequency comb (e.g., with several frequencies, such as 2-3 frequencies) or several laser signals can be introduced to readout the transmitted probe laser signal simultaneously at two or more loop laser signal detunings to make the systems more robust. These laser frequencies can be applied in a geometry where the laser frequencies are separated, applying them to different interaction regions in a Rydberg atom-based sensor, or different sensors altogether; or where the different laser frequencies interact with the same atoms in the vapor. In some implementations, different laser frequencies are applied to different groups of atoms, either in the same or different vapor cells.

To determine the phase and amplitude of the RF signal—which in some cases represent I and Q data—the probe laser signal (e.g., the probe laser signal after passing through the vapor cell) is converted from an optical signal to a detector signal by operation of an optical detector system, which can include a photodetector. The detector signal, which may be an electrical signal, is multiplied (e.g., beat) with electronic signals that are pi-shifted (e.g., shifted by 90 degrees) from one another, thereby generating first and second demodulated signals. The first demodulated signal may correspond to I, and the second demodulated signal may correspond to Q. This example uses the phase of a reference signal (e.g., a synchronization signal, a clock demodulation signal, a GPS demodulation signal, etc.) to demodulate the detector signal. Likewise, the RF signal can be encoded with I and Q signals that carry a reference modulation. The electronic signals that are pi-shifted from one another can be shifted by an additional phase that aligns the RF signal with reference signals encoded in the demodulation signal so as to properly read the reference modulation.

In some implementations, there may be a transient response of the vapor when a phase of the RF signal changes. For readout and preparation schemes where the response is Doppler limited, the phase can be averaged more over different velocity classes of the vapor (or atoms therein) via inhomogeneous broadening and the transient response of the vapor can be suppressed. However, the IQ detection can nevertheless be preserved in the Doppler limited cases, and the averaging can be beneficial in suppressing the transient phase shift. Collisions of the atoms in the Rydberg electronic states can also help to suppress the transient. When the interferometric loop is resonant (e.g., the detuning is equal to zero), all the laser signals and the RF signal are resonant with their respective transitions in the closed loop of transitions. The electronic system then does not oscillate and the phase is extracted from the amplitudes of the signals. The phase shifts necessary to align the phases, e.g., in-phase and quadrature, can be applied to one of the laser signals with an electro-optic modulator to create an in-phase and quadrature probe laser signal that is received from the vapor after passing therethrough.

In some implementations, the laser signals are all on resonance with their respective optical transitions (e.g., zero detuning). In these implementations, the oscillation frequency of the probe laser transmission may be zero. The phase and amplitude can be extracted in the resonance case by comparing the amplitudes of the transmission of at least two different loop laser phases, one in-phase and one in-quadrature with the RF signal. For example, the phase and amplitude can be extracted by comparing the amplitudes when one amplitude is the I signal and the other amplitude is the Q signal. In this case, the laser signal phases are changed (e.g., with an electro-optic phase shifter) to 'align' in phase, or equivalently in time, with the incoming RF signal. The laser signal that is aligned with the in-phase component of the RF signal (e.g., the cosine part) generates an I signal in its corresponding probe laser signal, and the laser signal that is aligned 90-degrees out of phase with the incoming RF signal (e.g., the sine part) generates a Q signal in its corresponding probe laser signal.

In some implementations, the systems include one or more vapor cells (e.g., a metrology vapor cell, a photonic crystal receiver, etc.) that are connected to a laser control and signal processing system. The one or more vapor cells each include a vapor having Rydberg electronic states (e.g., a vapor of Cs atoms). In certain cases, the signal processing system may be configured to acquire a time dependent analog signal via the principles of Rydberg atom-based RF electric field sensing. In these cases, the radio frequency of the electric field may be in a range from about 1 MHz to 300 GHz.

In these implementations, the probe laser signal may pass through the vapor of a vapor cell to be received by an optical detector system. In response, the optical detector system generates absorption signals that represent the adsorption and/or transmission of the probe laser signal when passing through the vapor. The absorption signals are demodulated in the electronics of the signal processing system by multiplying the absorption signal in analog or digital electronics by an oscillating signal whose phase relative to the incoming signal can be shifted. The demodulated signal can be digitized and stored in a digital format. The absorption signal can also be digitized and run through one or more response templates (e.g., filters) that correspond to the different phased reference signals. The response templates may be tailored to the atomic response. Examples of response templates and their use (including matched filters) are described further in U.S. Pat. No. 11,885,904 entitled "Sensing Pulses of Radio Frequency Fields".

In certain cases, the signal processing of the demodulated signal can be processed using field programmable gate arrays (FPGAs), graphics processing units (GPUs), central processing units (CPUs), or some combination thereof. Other electronic processing devices are also possible. Binary phase shift keying (BPSK) and even quadrature amplitude and phase (QAM) encodings are possible to readout. Phase encoded radar signals can also be detected. The detection technique is applicable to any looped laser configuration that can be closed by a target RF field.

There are a great number of cases in RF engineering where one needs to determine the power, the frequency, or the phase of a RF electromagnetic wave. For Rydberg atom-based sensing, detection of the phase with sufficient speed to meet communications and radar encoding timescales is an outstanding challenge. Workers in the field have utilized an RF reference, or local oscillator, to beat against a target RF electromagnetic wave. The readout of the signal has been slow and the generation of the RF local oscillator limits the broad bandwidth offered by Rydberg atom-based sensors. Scattering of the RF wave from the vapor cell sensors is also increased and sacrifices the electromagnetic transparency of the sensors. A second approach is to construct an interferometer within the atomic energy level structure that can be sensitive to the target RF wave phase. The resulting demonstrations of phase readout from a Rydberg atom-based sensor, so far, have resulted in readout that is too slow to usefully detect phase modulation in radar or communications pulses.

Now referring to FIG. 1, a schematic diagram is presented of an example system 100 for determining one or more properties of an RF signal 102. The one or more properties may include a phase of the RF signal 102, although in certain cases, the example system 100 may also determine other properties of the RF signal (e.g., an amplitude, a frequency, etc.). The RF signal 102 may be an RF electromagnetic wave, such as a pulsed or continuous RF wave. The example system 100 includes a vapor cell 104 that is configured to receive the RF signal 102 and contains a vapor 106. The vapor 106 has Rydberg electronic states, and as such, may be a vapor of Rydberg atoms (e.g., Rb, Cs, etc.). In many cases, the vapor cell 104 is a Rydberg atom-based vapor cell. Examples of vapor cells that are configured for Rydberg atom-based sensing are described in U.S. Pat. No. 10,859,981 entitled "Vapor Cells Having One or More Optical Windows Bonded to a Dielectric Body", U.S. Pat. No. 11,112,298 entitled "Vapor Cells for Imaging of Electromagnetic Fields", and U.S. Pat. No. 11,054,453 entitled "Photonic-Crystal Vapor Cells for Imaging of Electromagnetic Fields".

The example system 100 also includes a laser system 108 that is optically coupled to the vapor cell 104, such as through free space or through an optical fiber assembly. The laser system 108 may be configured to generate laser signals 110 that are transmitted to the vapor cell 104. For example, the laser system 108 may be configured to generate a probe laser signal 110*a* and loop laser signals 110*b* that are guided by optical fibers 112 to interact with the vapor 106 of the vapor cell 104. FIG. 1 depicts the probe laser signal 110*a* and the loop laser signals 110*b* propagating through the vapor 106 along a common optical pathway but in which the probe laser signal 110*a* propagates along a direction opposite that of the loop laser signals 110*b* (e.g., counter-propagating). However, other optical paths and directions are possible (e.g., co-propagating in the same direction). Examples of various configurations of laser signals and their interactions with a vapor having Rydberg states are described further in U.S. Pat. No. 10,509,065 entitled "Imaging of Electromagnetic Fields".

The vapor cell 104 is configured to generate an output optical signal 114 in response to receiving the laser signals 110. The output optical signal 114 may be based on one of the laser signals 110 after interacting with the vapor 106. For example, the output optical signal 114 may be based on the probe laser signal 110*a* after interacting with the vapor 106. Such interaction may alter an optical property of the probe laser signal 110*a*, such as an intensity, a frequency, a polarization, or a phase of the probe laser signal 110*a*. Combinations of altered optical properties are possible. The output optical signal 114 may represent a response of the vapor 106 to the RF signal 102 (e.g., a transient response, a steady-state response, etc.). In some variations, the RF signal 102 is defined by one or more RF pulses, and in certain cases, these pulses may be part of a radar signal or a communication signal.

In some instances, the probe laser signal 110*a* includes multiple probe frequencies (e.g., a frequency comb defines the probe laser signal 110*a*). In these instances, an optical property of the probe laser signal 110*a* at each probe frequency may be altered in response to interacting with the vapor 106 (e.g., an intensity, a polarization, a phase, etc.). In some instances, the probe laser signal 110*a* may change its frequency after interacting with the vapor 106. In such instances, the intensity of the probe laser signal 110*a* may be altered in response to the change in frequency.

The vapor 106 includes a set of electronic states, a portion of which, corresponds to the Rydberg electronic states. The set of electronic states may be positioned in energy such that transitions between neighboring pairs of electronic states fall along a pathway that forms a loop in energy. Moreover, the transitions include a plurality of optical transitions and an RF transition. Thus, when the laser signals 110 interact with the optical transitions and the RF transition interacts with the RF signal 102, the loop becomes energetically "closed" and can function as an interferometric loop that is sensitive to the phase and amplitude of the RF signal 102. In this manner, the vapor 106 can act as an atomic interferometer that allows the one or more properties of the RF signal 102 to be determined.

In many implementations, the vapor 106 defines an RF transition that is driven by the RF signal 102. The vapor 106 also defines a set of loop optical transitions and a probe optical transition. The set of loop optical transitions, together with the RF transition, forms a closed loop of transitions. Moreover, the set of loop optical transitions includes a first loop optical transition that shares an energy level with the probe optical transition. In these implementations, the loop laser signals 110*b* drive the set of loop optical transitions. For example, individual loop laser signals 110*b* may drive respective ones of the loop optical transitions. The probe laser signal 110*a* also drives the probe optical transition to produce the output optical signal 114 from the vapor cell 104. In certain cases, the loop laser signals 110*b* include a detuned loop laser signal that drives, and is detuned relative to, the first loop optical transition.

Figure 2:
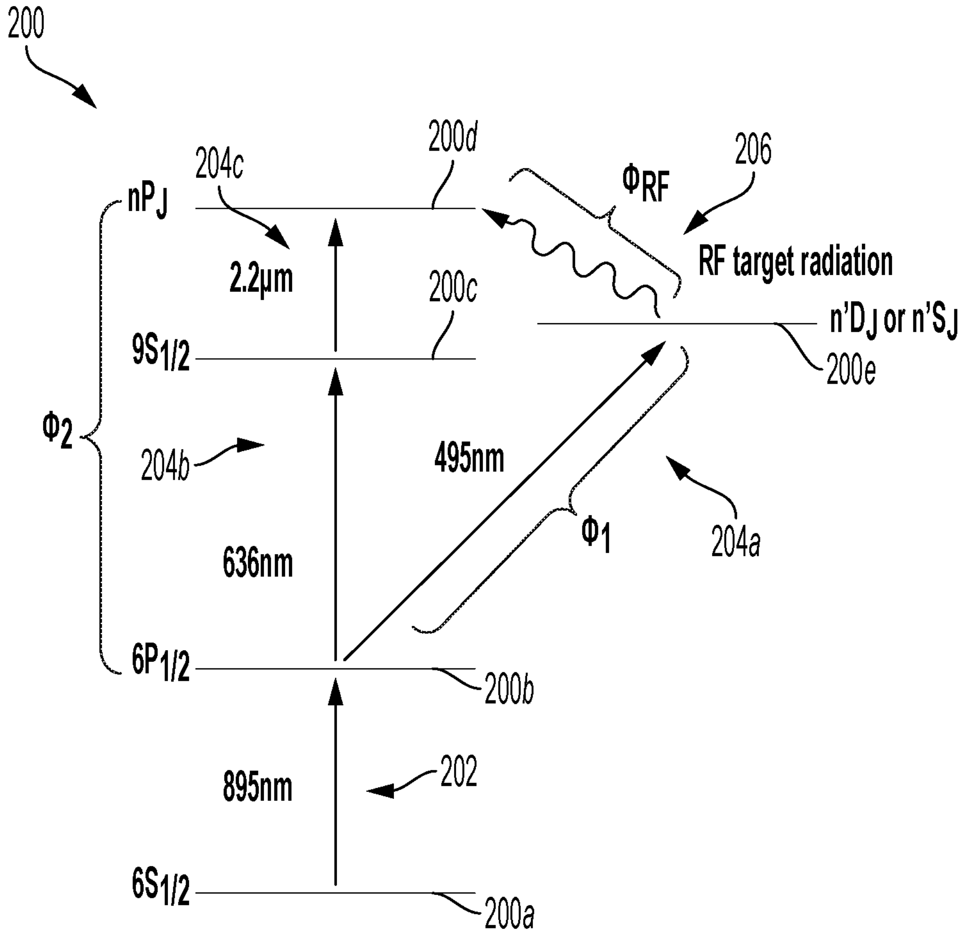
FIG. 2 is a schematic diagram of an example set of electronic states for a vapor in a vapor cell.

FIG. 2 presents a schematic diagram of an example set of electronic states 200 for a vapor in a vapor cell. The vapor is analogous to the vapor 106 described in relation to the vapor cell 104 of FIG. 1. The example set of electronic states 200 includes four electronic states 200*a-d*, with electronic state 200*d* being a first Rydberg electronic state of the vapor. The electronic states 200*a-d* increase progressively in energy and define three optical transitions. More specifically, a first pair of electronic states 200*a-b* defines a probe optical transition 202 (e.g., at $\lambda$=895 nm); a second pair of electronic states 200*b-c* defines a second loop optical transition 204*b* (e.g., at $\lambda$=636 nm); and a third pair of electronic states 200*c-d* defines a third loop optical transition 204*c* (e.g., at $\lambda$=2.2 μm). The example set of electronic states 200 also includes electronic state 200*e* that corresponds to a second Rydberg electronic state of the vapor. The energy levels 200*b-e* define a first loop optical transition 204*a* (e.g., at $\lambda$=495 nm), and the energy levels 200*d-e* define an RF transition 206 that can be driven by an RF signal (e.g., an RF field of the RF signal).

As can be seen in FIG. 2, the first through third loop optical transitions 204*a-c* form a closed loop of transitions when combined with the RF transition 206. The closed loop of transitions may include first and second loop segments that each extend between a common pair of energy levels. For example, the first loop segment may extend from electronic state 200*b*, which is at a lowermost energy level of the closed loop of transitions, to electronic state 200*d*, which is at the uppermost energy level of the closed loop of transitions. The first loop segment includes the first loop optical transition 204*a* and the RF transition 206 (e.g., $\Phi_1+\Phi_{RF}$ in FIG. 2). Similarly, the second loop segment may extend between electronic states 200*b*, 200*d* but include the second and third loop optical transitions 204*b*, 204*c* (e.g., $\Phi_2$ in FIG. 2). In these cases, the probe optical transition 202 and the first loop optical transition 204*a* share electronic state 200*b* in common and thus the lowermost energy level of the closed loop of transitions. In FIG. 2, the first loop optical transition 204*a* (which may be driven by a detuned loop laser signal) and the RF transition 202 are part of the same loop segment. However, other arrangements are possible. For instance, the first loop optical transition 204*a* and the RF transition 202 may be part of different loop segments.

The closed loop of transitions can operate as an interferometric loop when first through third loop optical transitions 204*a-c* are driven by respective laser signals and the RF transition 206 is driven by the RF signal. The interferometric loop can be used to measure one or more properties of the RF signal, such as a phase of the RF signal, an amplitude of the RF signal, a frequency of the RF signal, and so forth. The left-hand side of FIG. 2 shows a ladder of electronic states that can support a three-photon read-out scheme. Adding a laser signal at 495 nm, as shown on the right-hand side of FIG. 2, makes a loop in the upper levels that is sensitive to the phase and the amplitude of the RF signal. Detuning one of the laser signals or the RF signal results in a non-equilibrium electronic system that oscillates. The phase and the amplitude of the RF signal can be derived from the oscillating signal as well as the detuning.

FIG. 2 also shows the laser and atomic configuration of the example interferometric loop. The probe laser signal at 895 nm probes the closed loop and the interference between the two primary pathways around the loop. The two primary pathways include a right-handed path and a left-handed path. These pathways add the phases in different ways as a sign change occurs in the phase for an upward versus a downward transition. For example, the right-handed pathway in FIG. 2 has an overall phase, $\Phi^R_{Total}=\Phi_1+\Phi_{RF}-\Phi_2$ while the left-handed pathway has an overall phase $\Phi^L_{Total}=-\Phi_1-\Phi_{RF}+\Phi_2$. Since the terms with these phases add and they have the same amplitudes, the result is a sinusoidal dependence. For the resonant case where the detuning is zero, the phases are determined by the relative phases of the fields and the transmission of the probe laser signal is affected by the relative phase of the fields. If the phases of the laser signals are stable or known, the phase of the RF signal can be determined. Further examples of the closed loop of transitions and its method of use are described in relation to FIGS. 3A-8.

Now referring back to FIG. 1, the example system 100 additionally includes an optical detector system 116 that is configured to generate a detector signal 118 based on the output optical signal 114. The optical detector system 116 may, for example, include one or more optical elements (e.g., lenses, mirrors, polarizers, filters, gratings, beam splitters, etc.) that can be controlled to manipulate the output optical signal 114. Such manipulation may allow the optical detector system 116 to measure a target optical property of the output optical signal 114, such as via a photodetector. In certain cases, the optical detector system 116 includes a photodetector configured to measure a target optical property of the output optical signal 114, such as an intensity of the output optical signal 114 at a specific frequency (or within range of frequencies). In these cases, the optical detector system 116 may include multiple photodetectors, each configured to measure a different target property of the output optical signal 114.

The example system 100 also includes a signal processing system 120 that is configured to determine the one or more properties of the RF signal 102 based on the detector signal 118. The signal processing system 120 may, for example, receive the detector signals 118 from the optical detector system 116 and may include analog electronics, digital electronics, or both, for processing the detector signals 118 once received. The signal processing system 120 is also configured to generate data representing the response of the vapor 106 to the RF signal 102. In some variations, the optical detector system 116 is configured to generate analog signals and the signal processing system 120 is configured to convert the analog signals into digital signals for processing. In these variations, the signal processing system 120 may include circuits for parallel processing of the digital signals (e.g., FPGAs, ASICs, GPUs, etc.).

In some implementations, the signal processing system 120 is configured to determine the one or more properties of the RF signal 102 by operations that include generating, based on the detector signal 118, oscillation data that represents an oscillation of the output optical signal 114 as the laser signals 110 and the RF signal 102 interact with the vapor 106 over time. The oscillations may be induced by detuning one or more of loop laser signals 110*b* relative their respective loop optical transitions and/or the RF signal 102 relative to the RF transition. The operations also include determining the one or more properties of the RF signal 102 based on the oscillation data. The one or more properties may include a phase of the RF signal 102, an amplitude of the RF signal 102, a frequency of the RF signal 102, or some other property of the RF signal (e.g., a polarization). Combinations of properties are also possible (e.g., a phase and an amplitude of the RF signal 102). In many cases, the one or more properties includes a phase of the RF signal 102. In some cases, the operations include generating quadrature data and in-phase data based on the oscillation data. In these cases, the one or more properties of the RF signal 102 may be determined based on the quadrature and in-phase data. In some cases, the RF signal 102 has a frequency that is detuned relative to the RF transition, and the one or more properties of the RF signal 102 includes the frequency of the RF signal 102.

In some implementations, the example system 100 includes a data processing system 122 in communication with the signal processing system 120 through a communication channel 124. The communication channel 124 may be defined, for example, by a wired connection (e.g., an Ethernet connection) or a wireless connection (e.g., a WiFi connection). The data processing system 122 is configured to receive the data from the signal processing system 120, such as for display, for storage, for further processing, or some other type of operation. The data processing system 122 may include a computer that serves as a user interface 126 of the example system 100. Examples of the computer include a desktop computer, a workstation, a server, a laptop, a tablet, a mobile device, and so forth. The user interface 126 is configured to allow a user of the example system 100 to view the data from the signal processing system 118. However, other functionality is possible (e.g., displaying information related to the optical detector system 116, controlling the optical detector system 116, etc.). The data processing system 122 may also be configured to control the signal processing system 120, such as by using the communication channel 124*a* therebetween to send control signals (e.g., instructions, data, etc.) to the signal processing system 120. However, data processing system 122 may be configured to control other components of the example system 100, such as the laser system 108 and the optical detector system 116.

In some implementations, the example system 100 includes a communication channel 124*b* between the data processing system 122 and the laser system 108. In these implementations, the data processing system 122 may be configured to control the laser system 108, thereby allowing the data processing system 122 to control an optical property of one or more laser signals 110 generated by the laser system 108. Such control may include altering or maintaining the optical property, and examples of the optical property include an intensity, a frequency, a polarization, and a phase of the one or more laser signals 110. Combinations of optical properties are possible.

In certain cases, the data processing system 122 may act to tune or detune one of the laser signals 110 relative to an optical transition of the vapor 106 (e.g., the detuned loop laser signal relative to the first loop optical transition). In doing so, the data processing system 122 may instruct the laser system 108 to alter a frequency of the one laser signal 110. For example, the data processing system 122 may instruct the laser system 108 to alter a frequency of the detuned loop laser signal, thereby altering a difference between the frequency of the detuned loop laser signal and a frequency of the first loop optical transition. If the resulting difference is non-zero, the detuned loop laser signal is "detuned" relative to the frequency of the first loop optical transition. For example, the detuned laser signal may be "detuned" at least 1 MHz higher (e.g., +2 MHz) than the frequency of the first loop optical transition. As another example, the detuned laser signal may be "detuned" at least 1 MHz lower (e.g., −3 MHz) than the frequency of the first loop optical transition. If the resulting difference is zero (or thereabout), the detuned loop laser signal is "on resonance" with the first loop optical transition. The process of detuning laser signals 110 may be part of a method for determining the phase of the RF signal 102, such as described below for the second and third example methods. In some instances, multiple laser signals 110 are detuned relative to respective loop optical transitions of the vapor 106.

In some implementations, the laser system 108 may be configured to generate one or more frequency combs. For example, the laser system 108 may be configured to generate a first frequency comb that defines the probe laser signal 110*a*. In these cases, the first frequency comb includes first comb laser signals at respective laser frequencies, with at least one of the first comb laser signals being on resonance with the probe optical transition. By defining the probe laser signal 110*a* with the first frequency comb, the example system 100 may gain an advantage of reading out oscillations at many probe laser frequencies. As another example, the laser system 108 is configured to generate a second frequency comb that defines the detuned loop laser signal. In these latter cases, the second frequency comb includes second comb laser signals at respective laser frequencies that are detuned relative to the first loop optical transition. By defining the detuned loop laser signal with the second frequency comb, the example system 100 may gain an advantage of reading out the output optical signal 114 at several detunings at the same time. Examples of frequency combs are described further in relation to U.S. Pat. No. 11,658,461 entitled "Tuning the Output of a Laser".

In some implementations, the example system 100 includes a communication channel 124*c* between the data processing system 122 and the optical detector system 116. In these implementations, the data processing system 122 may be further configured to control the optical detector system 116, thereby allowing the optical detector system 116 to measure one or more target properties of the output optical signal 114. Such control may include controlling optical elements of the optical detector system 116 to select a target optical property of the optical signal 114. This control may also include controlling one or more photodetectors, each configured to measure a different target optical property. In some implementation, the laser system 108, the optical detector system 116, the signal processing system 120, and the communication channels 124*a-c* are part of the data processing system 122.

Figure 3A:
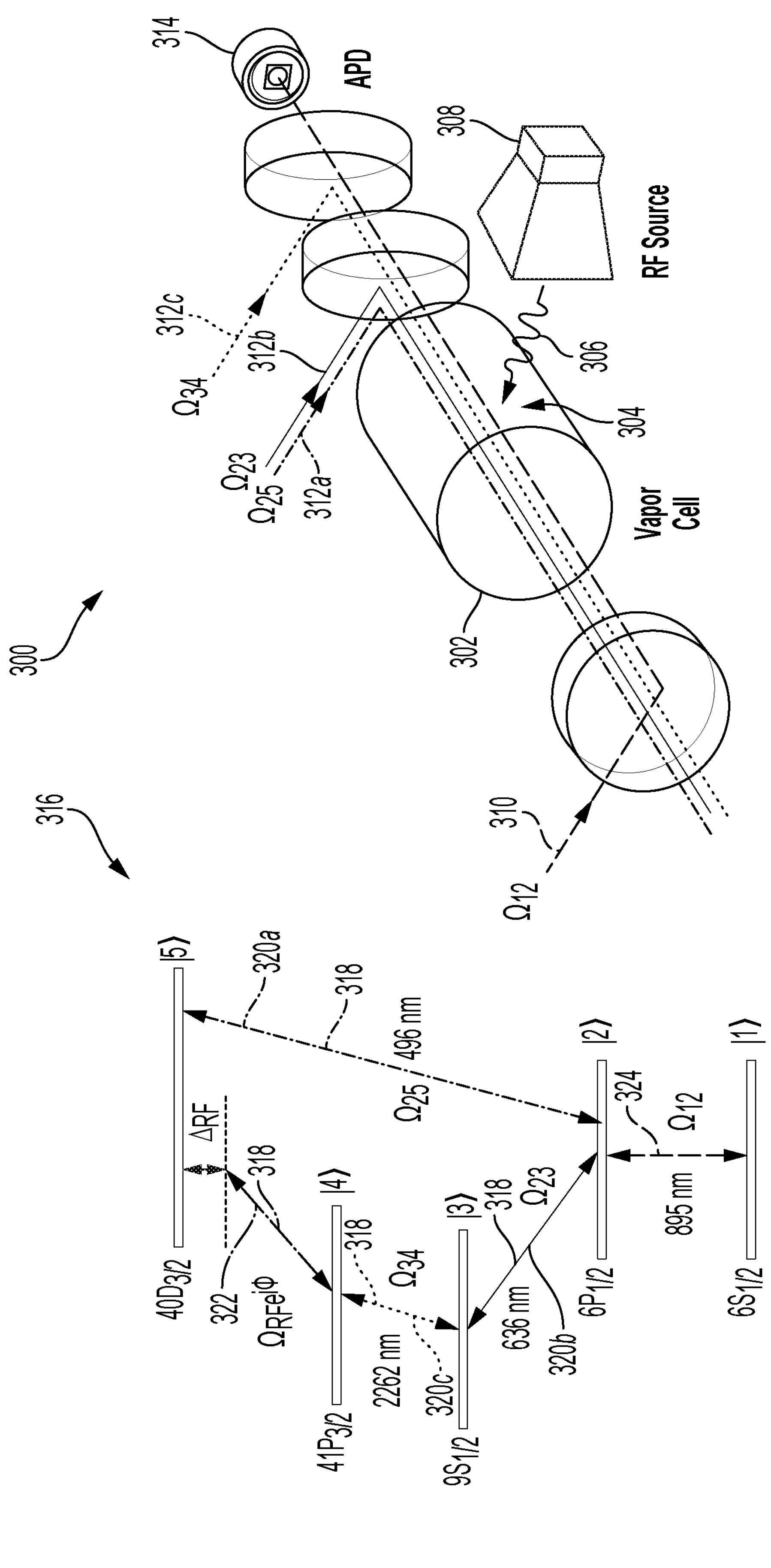
FIG. 3A is a schematic diagram an example system that includes vapor cell with a vapor of cesium atoms therein.

Now referring to FIG. 3A, a schematic diagram is presented of an example system 300 that includes vapor cell 302 with a vapor of cesium atoms 304 therein. The example system 300 is configured to determine a phase of an RF signal 306 (e.g., an RF wave) and may be analogous to the example system 100 described in relation to FIGS. 1-2. Along with determining the phase of the RF signal 306, the example system 300 may, in certain cases, also determine other properties of the RF signal 306 (e.g., an amplitude, a frequency, etc.). The RF signal 306 may be based on an RF electromagnetic wave, such as a pulsed or continuous RF wave.

The vapor cell 302 configured (e.g., positioned) to receive the RF signal 306 from an RF source 308, such as an RF antenna. The vapor cell 300 contains the vapor of cesium atoms 304 (e.g., thermal cesium atoms). The example system 300 includes a laser system that is configured to generate laser signals, such as a probe laser signal 310 ($\Omega_{12}$) and loop laser signals 312*a-c* ($\Omega_{25}$, $\Omega_{23}$, $\Omega_{34}$). In some cases, such as shown in FIG. 3A, the probe laser signal 310 counter-propagates against the loop laser signals 312*a-c* to minimize spatial phase shifts. In some cases, the RF signal 306 is configured to co-propagate with the loop laser signals 312*a-c*, with the probe laser signal counterpropagating. Other propagation configurations are possible for the laser signals 310, 312 and the RF signal 306. The example system 300 also includes an optical detector 314, such as an avalanche photodetector (APD). The intensity of the probe laser signal 310 is measured by the optical detector 314 after passing through the vapor cell 302.

The left portion of FIG. 3A shows, in exploded view, a closed loop excitation scheme 316 of the vapor of cesium atoms 304. The phase-sensitive loop 318 includes a first loop optical transition 320*a* ($\Omega_{25}$) that can interact with the first loop laser signal 312*a*. In certain cases, the first loop optical transition 320*a* has a first energy gap that corresponds to a blue wavelength of 496 nm. The phase-sensitive loop 318 also includes second and third loop optical transitions 320*b*, 320*c* ($\Omega_{23}$ and $\Omega_{34}$) that can interact with, respectively, the second loop laser signal 312*b* and the third loop laser signal 312*c*. In certain cases, the second loop optical transition 320*b* has a second energy gap that corresponds to a red wavelength of 636 nm, and the third loop optical transition 320*c* has a third energy gap that corresponds to an infrared wavelength of 2262 nm. The phase-sensitive loop 318 additionally includes an RF transition 322 ($\Omega_{RF}$) that can interact with the RF signal 306. Collectively, the first through third loop optical transitions 320*a-c* and the RF transition 322 define a closed loop of transitions 318 that can function as an interferometric loop when interacting with the loop laser signals 312 and the RF signal 306. In FIG. 3A, ARF indicates the possibility of the RF signal 306 being detuned relative to the RF transition 322. In cases where the RF signal 306 is detuned, ARF is non-zero. However, in cases where the RF signal 306 is on resonance, ARF is zero.

Figure 3B:
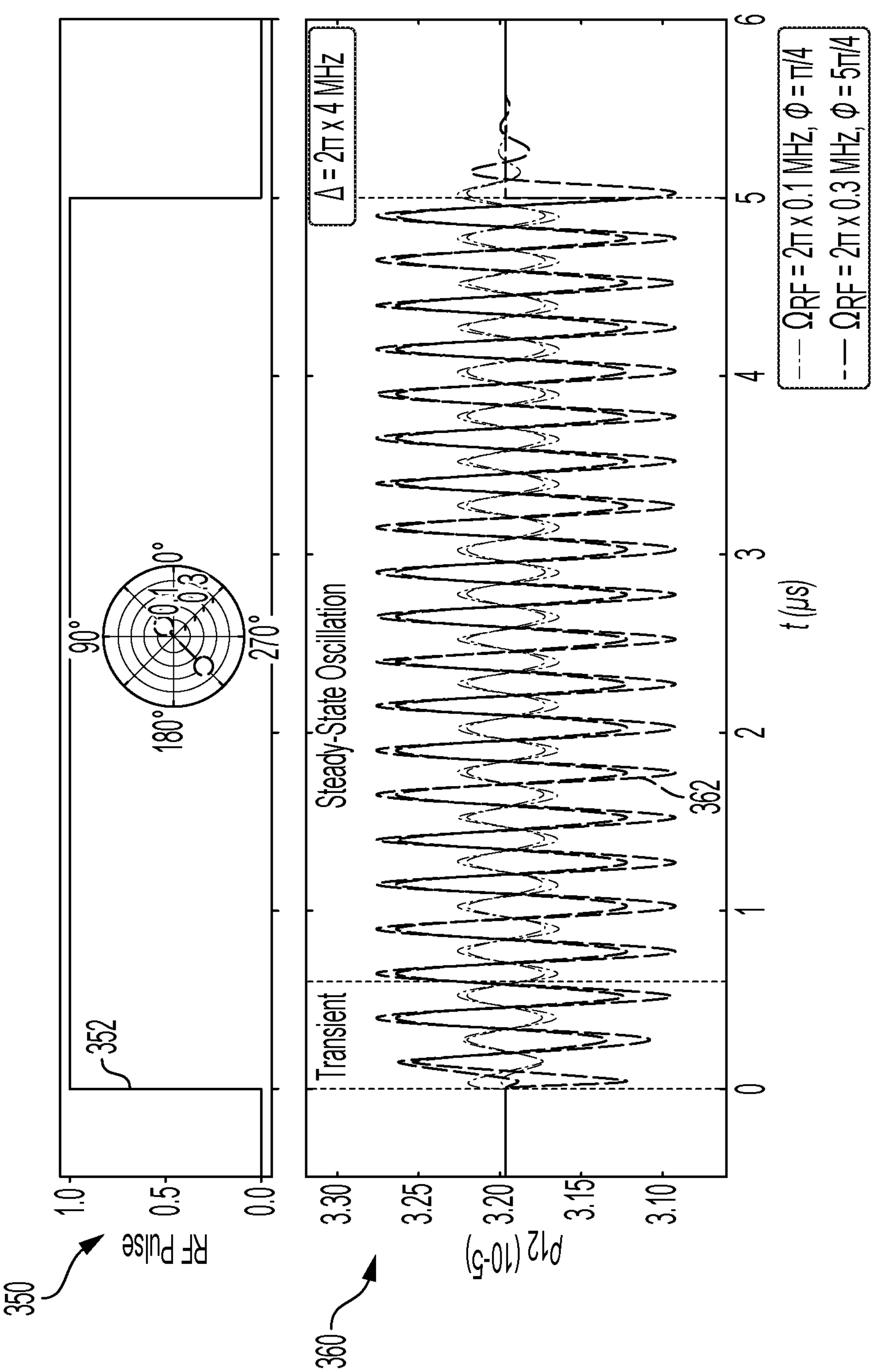
FIG. 3B is a pair of graphs showing an oscillating transmission intensity of a probe laser signal of the example system of FIG. 3A.

The example system 300 may be used to determine the phase of the RF signal 306. However, other properties are possible, such as the frequency or the amplitude of the RF signal 306. The probe optical transition 324, which is a ground state transition that is driven by the probe laser signal 310, is not part of the interferometric loop 318 but serves to probe the dynamics of the loop 318. For a finite detuning of the first loop laser signal 312*a* (e.g., $\Delta_{25}$), the example system 300 transitions to a situation where the two interference pathways of the interferometric loop 318 beat against each other, leading to the time dependent oscillations shown in the graphs of FIG. 3B. The upper graph 350 of FIG. 3B presents an example of a single pulse sequence 352 of two different RF waves with different E-field amplitudes and phase. The lower graph 360 of FIG. 3B presents an example of the non-equilibrium dynamics of the measured probe laser transmission intensity 362 as a function of time. Prior and post the RF-pulse, the intensity 362 reaches the steady-state limit. However, during the RF pulse 352, the interferometric loop is closed and, due to the finite detuning, A, the example system undergoes oscillatory dynamics, $\Delta=2\pi\times4$ MHz.

In many implementations, the example system 300 utilizes optical interferometry of the vapor 304 to read out properties of the RF signal 306. For example, an "optical+RF signal under test" closed loop 318 may be used to simultaneously read-out the amplitude and phase—which, in certain cases, represent in-phase (I) and quadrature (Q) data—of the RF signal 306 using Rydberg atom-based RF sensing. Transitions around the loop 318 can form a circuit in two different ways. For instance, one loop can be associated with a path that is clockwise, starting from the upper level of the probe laser transition 324. A second loop can be associated with a path that is counterclockwise, starting from the upper level of the probe laser transition 324. In a first direction, the phase is 'positive' associated with an upward transition while in a second, opposite direction the phase is 'negative' associated with a downward transition. The labels 'negative' and 'positive', however, can be interchanged since the relative relationship is preserved.

When one of the fields (e.g., a laser signal field or an RF field) making up the loop is detuned, the phase becomes time dependent since there is an ωt dependence to the phase. Although the frequencies of the loop laser signals 312 can be large, it is the difference in phase between the paths that beats, so the example system 300 oscillates at the frequency of the detuning, Δ. The phase of the oscillating beat note can be determined by the overall phase shift in the loop 318. If the loop laser signals 312 all have zero phase relative to a phase reference, then the phase shift is that of the RF signal 306 (e.g., an electric field thereof). The phase reference may be, for example, an external signal, a clock, or other timing reference to which a time at t=0 can be linked. The phase reference may serve as an over phase of the loop laser signals 312, or in the case of detuning, just a clock. It is also possible for the RF signal 306 to be encoded with reference information (e.g., a synchronization signal). The phases of the loop laser signals 312 can be set to the phase reference by using a phase shifter such as a delay line or an electro-optic phase modulator. It is also possible to record a transmission of the probe laser signal 310 and demodulate it by multiplying it by a sinusoidal signal with a variable phase shift. The phase shift of the demodulating signal can be adjusted to align with the reference or be chosen arbitrarily, thus measuring the RF signal 306 relative to the demodulating signal (and its reference, such as a clock).

In some implementations, the closed loop excitation scheme 316 allows phase detection via the interference of multi-photon coherence transfer pathways. For example, in the four-photon scheme shown in FIG. 3A, a phase-dependent vapor response is driven by the coherent superposition of a clockwise and a counter-clockwise closed-loop process. These two loop processes can contribute phase terms of $e^{i\phi}$ and $e^{-i\phi}$, respectively, yielding a $\cos(\phi)$ modulation. Under the weak probe approximation, e.g., $\Omega_{12} \ll \Omega_{ij} (ij \neq 1, 2)$, the response of the vapor 304 may be represented by Equation (1):

$$\rho_{12} = \frac{C_{12}}{1 + \frac{C_{23}C_{32}}{\frac{C_{34}C_{43}}{1 + C_{RF}C'_{RF}}} + \frac{C_{25}C_{52}}{\frac{C_{RF}C'_{RF}}{1 + C_{34}C_{43}}} - \frac{2C_{23}C_{34}C_{RF}\cos(\phi)}{1 + C_{34}C_{43} + C_{RF}C'_{RF}}} \quad (1)$$

where the coherence of two atomic states is $C_{jk} := i\Omega_{jk}/(\gamma_k + 2i\Delta_k)$. Here, $\Omega_{jk} = \mu_{jk}E_{jk}/\hbar$ is the Rabi frequency of driving field, and $\gamma_k$ is the decay rate of state $|k\rangle$. $\Delta_k$ denotes the multi-photon detunings, given by $\Delta_2 = \Delta_{12}$, $\Delta_3 = \Delta_{12} + \Delta_{23}$, $\Delta_4 = \Delta_{12} + \Delta_{23} + \Delta_{34}$, and $\Delta_5 = \Delta_{12} + \Delta_{25}$.

In these cases, the loop phase $\phi$ may be represented by Equation (2):

$$\phi = \Delta_{eff} \cdot t + \varphi_{eff} + k_{eff} \cdot z + k_{eff} \cdot v \cdot t \quad (2)$$

where $\Delta_{eff} = \Delta_{23} + \Delta_{34} + \Delta_{RF} - \Delta_{25}$ is the effective detuning of the closed loop; $\varphi_{eff} = \varphi_{23} + \varphi_{34} + \varphi_{RF} - \varphi_{25}$ is the relative phase term; $k_{eff} = k_{23} + k_{34} + k_{RF} - k_{25}$ is the effective wave vector; and v is the atomic velocity. When a detuning is applied to one of the loop optical transitions 320*a-c* in the loop 318, the accumulated phase becomes time-dependent. This time-varying phase is imprinted on the transmission of the probe laser signal 310 through the $\cos(\phi)$ term, manifesting as detectable periodic oscillations at the detuning frequency. If the RF signal 306 (or field thereof) is applied perpendicular to the laser propagation direction, $k_{eff}$ is not perfectly compensated. However, the spatial phase term $k_{eff} \cdot z$ can be limited by the interaction region when it is confined by the beam waists to a range comparable to $1/k_{eff}$, thus ensuring that spatial phase averaging does not wash out the signal. The perpendicular geometry of the RF signal 306 can be more straightforward to implement than an end-on geometry where the RF wave runs in the same direction as the lasers and shows that, for many cases, a system can be designed where the end-on geometry is not necessary. The end on geometry is preferred because it eliminates the spatial phase. The velocity-dependent term $k_{eff} \cdot v \cdot t$ may introduce a Doppler phase shift. Upon integration over the thermal velocity distribution, this term can manifest as a negligible slow amplitude decay rather than a frequency shift. Consequently, the probe laser signal oscillates at the effective loop detuning frequency $\Delta_{eff}$, allowing the phase of the RF signal 306 to be extracted from the oscillatory dynamics.

In some implementations, methods may be used to determine the phase of an RF signal using a vapor cell. The methods may also determine the amplitude of the RF signal. The vapor cell may be configured as a Rydberg atom-based vapor cell and may be used, for example, to measure the phase and the amplitude all-optically (e.g., via laser signals). In certain cases, the phase and the amplitude represent in-phase (I) and quadrature (Q) data. The example systems 100, 300 described in relation to FIGS. 1 and 3 may be configured to perform these methods.

In some implementations, a first example method includes operating the lasers all on resonance. In these implementations, an RF field is incident on a vapor cell and is on-resonance with the RF transition of a vapor therein. The laser signals are also on-resonance with their respective optical transitions. These cases correspond to $\Delta=0$ for the RF field and all laser fields. To measure the in-phase and quadrature components of the RF field, two measurements can be made. These measurements can take place in different vapor cells, sections of a single vapor cell, or at two different times in close enough succession from one another that the RF field is unchanged. A first measurement is done in-phase while a second measurement is done in-quadrature by phase shifting a field of one of the laser signals by $$\frac{\pi}{2}.$$

Figure 4:
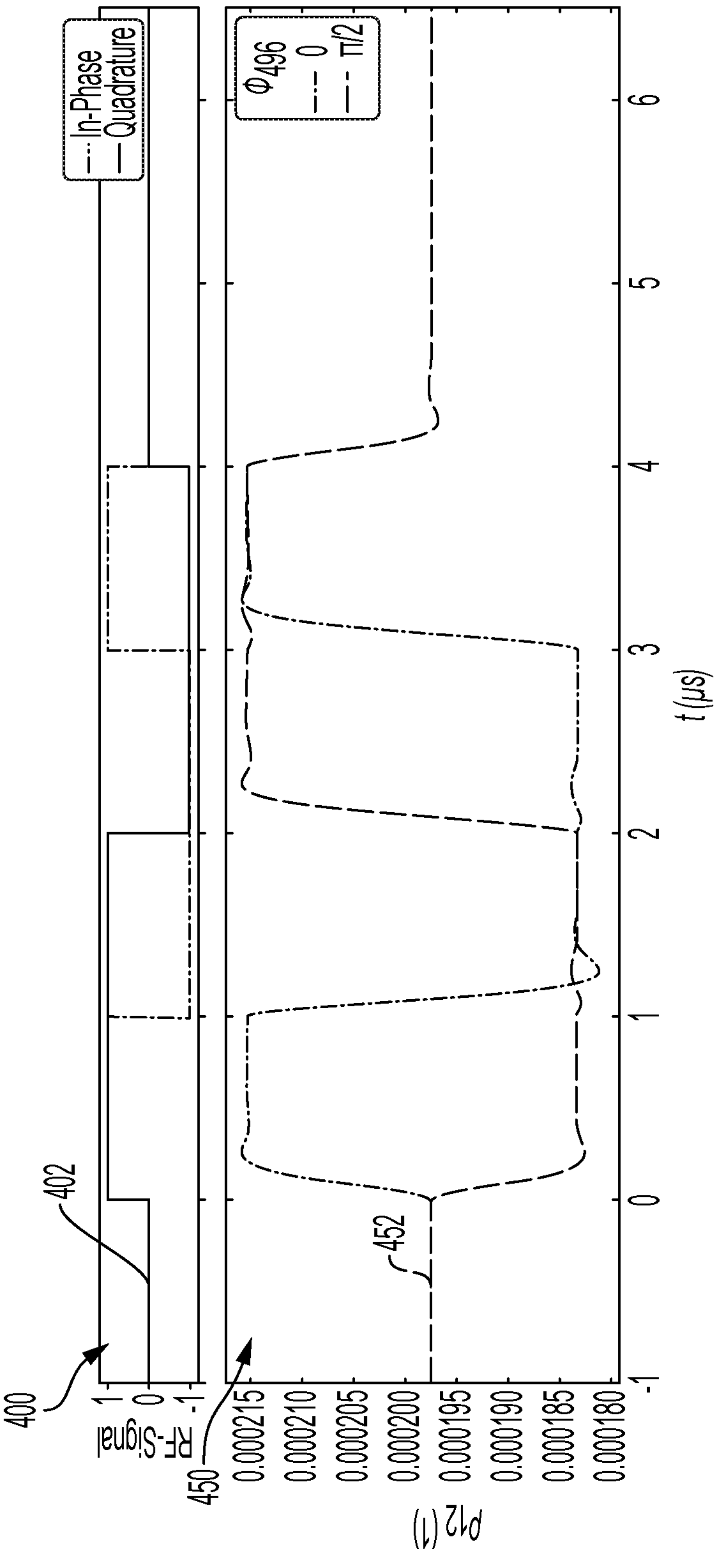
FIG. 4 is a pair of graphs showing an example readout of symbols encoded in an RF signal.

The results of the measurements are amplitudes. The I component is the in-phase component while the Q component is the quadrature component. The phase 'zero' can be set by a phase reference like a clock, or alternatively, the phases of the laser signals can be shifted to align with the phase of the target RF signal. However, if the RF signal is off-resonance then the electronic system of the vapor will oscillate. In these cases, I and Q are measured using amplitudes that are more sensitive to noise. FIG. 4 presents graphs based on calculations for the first example method. Another measurement method may be used in cases where the electronic system oscillates when the RF signal is detuned.

FIG. 4 presents a pair of graphs 400, 450 showing an example readout of symbols encoded in an RF signal. The example readout may be performed using the example systems 100, 300 described in relation to FIGS. 1 and 3, respectively. The upper graph 400 shows the phase modulation of the RF signal 402 with quadrature amplitude modulation. The amplitude is 1 while there are 4 phases, $$\frac{\pi}{4}, \frac{3\pi}{4}, \frac{5\pi}{4} \text{ and } \frac{7\pi}{4}.$$

This arrangement gives 4 symbols corresponding to (+1,+1), (−1,+1), (−1,−1) and (+1, −1) where the first symbol in each pair of symbols represents the I value and the second symbol in each pair of symbols represents the Q value. All four symbols are shown in the upper graph 400. The corresponding matrix 452 element for probe laser absorption is shown in the lower graph 450 and is based on a phase shift of the 496 nm laser signal. In FIG. 4, the readout reproduces the information encoded in the symbols depicted in the upper trace.

In some implementations, a second example method includes operating one of the lasers at a detuned frequency relative to its optical transition. In these implementations, the detuned loop laser signal is detuned relative to a loop optical transition, such as the first loop optical transition described in relation to FIG. 1. However, in certain cases, the RF signal can also be detuned. The transmission of the probe laser signal, which corresponds to the output optical signal from the vapor cell, oscillates in time, as shown in FIG. 3. This oscillation may, in certain cases, have an oscillation frequency that corresponds to the detuning frequency of the detuned loop laser signal.

The transmission of the probe laser signal can be measured by an optical detector (e.g., a photodetector) and the resulting absorption signal demodulated using analog or digital circuitry in a signal processing system. In certain cases, the absorption signal is first converted to a digital signal using an analog to digital converter. In certain cases, the demodulation happens in a digital circuit, like an FPGA. To demodulate the digitized absorption signal, it can, for example, be split and multiplied by a sine and a cosine function (e.g., sinusoidal signals that are shifted by 90 degrees). A first split signal derived from the cosine function is I while a second split signal derived from the sine function is Q. In this example, I and Q are referenced to the internal clock of the digitized signal (e.g., the sine and cosine functions). However, the split signals can be referenced to other types of clocks or synchronization signals, including ones carried on the RF signal.

Figure 5:
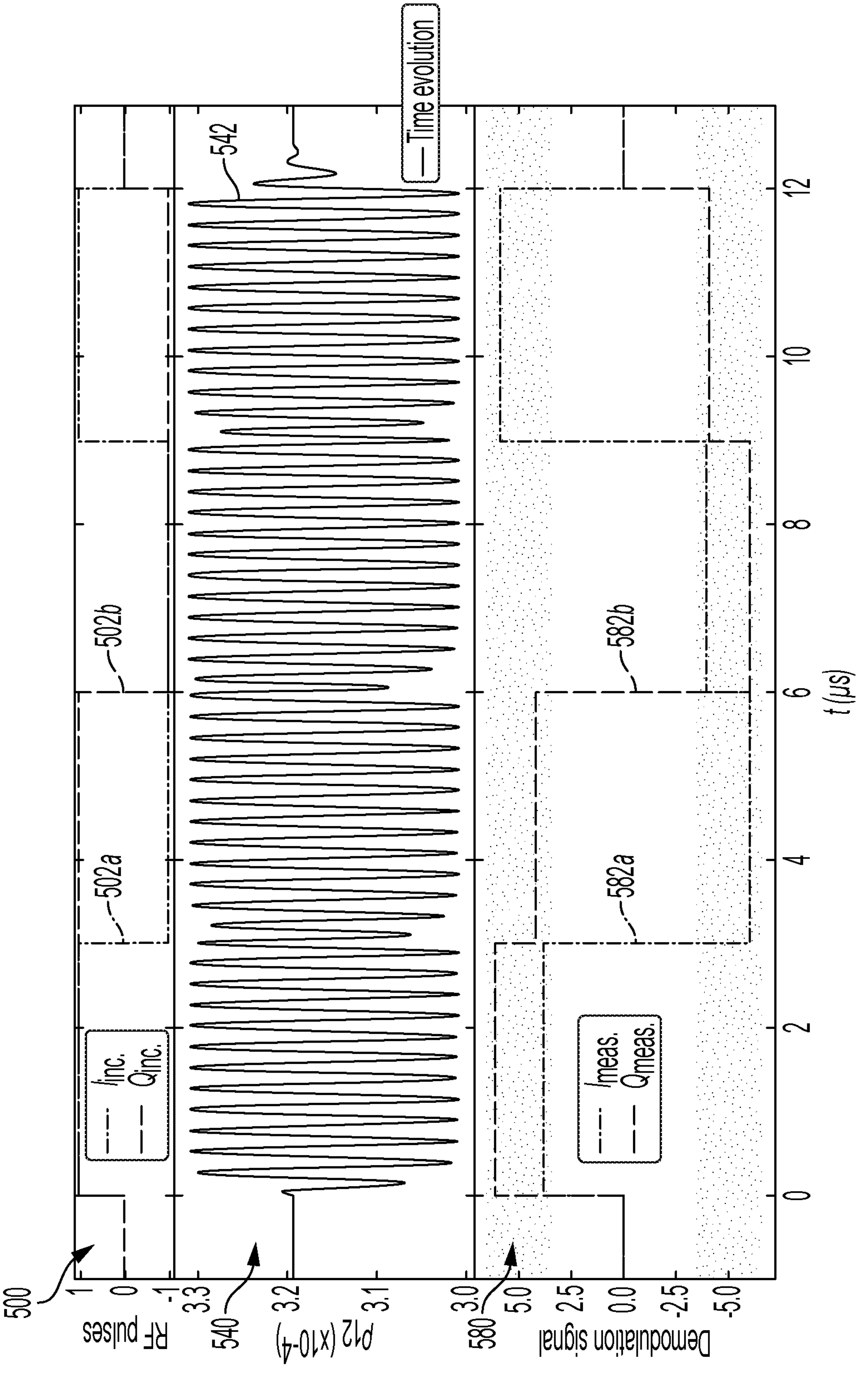
FIG. 5 is a series of graphs showing a second example readout of symbols encoded in an RF signal.

For example, phase shifts can be applied to the internal reference signals to obtain signals that are in-phase (I) and in quadrature (Q) with the source RF signals. The phase shifts described here can be a part of communication protocol since the same procedure is applied in those cases. One way to do this is to make the first symbols of the transmission standard so that the phases are aligned to detect those predetermined signals. Response templates (e.g., matched filters) for the predetermined symbols can also be used in this case since most communications protocols use a known alphabet e.g., {(1,1), (1,−1), (−1,1), (−1,−1)}. The first signals can be used to determine correlations between the incoming signals and the possible in-phase and quadrature symbols. The oscillating signal may provide advantages over the amplitude signal because the oscillations provide additional information (e.g., positions of zero crossings) that can be used to reduce errors. The oscillation frequency can also be used to determine the detuning of the RF signal if the other detunings are known, since they can contribute to determining the oscillation frequency. In certain cases, a feedback circuit can be used for a fixed laser signal detuning such that the oscillations are kept at a constant frequency. Thus, the RF detuning could be determined by measuring the laser detuning. Moreover, the laser detuning can be the sum of the fixed laser detuning plus a compensation for the RF detuning. FIG. 5 presents graphs based on the calculations of the second example method.

FIG. 5 presents a series of graphs 500, 540, 580 showing a second example readout of symbols encoded in an RF signal. The example readout may be performed using the example system 100 described in relation to FIG. 1 or the example system 300 described in relation to FIG. 3. In the upper graph 500 of FIG. 5, a first curve 502*a* represents the in-phase (I) signal while a second curve 502*b* represents the quadrature (Q) transmitted signal. The series of pulses shows the entire alphabet (1,1), (1,−1), (−1,1) and (−1,−1) corresponding to four points in the IQ coordinate system, all with the same amplitude, but having respective phases that differ by 90 degrees. The middle graph 540 of FIG. 5 shows the absorption signal 542, which is proportional to $\rho_{12}$. Here, the 496 nm laser has been detuned by about 2π×4 MHz. The oscillations in the middle graph are clear, and the phase shifts can be identified in the regions where the symbols change. Moreover, in this case, the amplitude is the same for each symbol, so the amplitude of the oscillations is uniform. The bottom graph 580 of FIG. 5 shows the demodulated signal 582. with a first curve 582*a* representing the in-phase (I) component and a second curve 582*b* representing the quadrature (Q) component.

The example systems 100, 300 of FIGS. 1-3 may be configured to perform the second example method. For example, the data processing system 122 of FIG. 1 may instruct the laser system 108 to detune the detuned loop laser signal relative to the first loop optical transition by a detuning frequency. The oscillation of the output optical signal 114 may then have an oscillation frequency that corresponds to the detuning frequency. In these cases, the signal processing system 120 may determine the one or more properties of the RF signal 102 by operations that include generating, based on the detector signal 118, oscillation data that represents an oscillation of the output optical signal 114 as the laser signals 110 and the RF signal 102 interact with the vapor 106 over time. The operations may also include determining the one or more properties of the RF signal 102 based on the oscillation data. The one or more properties include the phase of the RF signal 102. However, other properties are possible, such an amplitude of the RF signal 102, a frequency of the RF signal 102, and so forth.

In certain cases, the RF signal 102 may include a time series of RF pulses, and the oscillation data is generated over time. Determining the one or more properties of the RF signal 102 may then include comparing the oscillation data with a response template to generate a correlation value. The response template represents a known response of the vapor 106 to a reference RF pulse having a reference phase and a reference amplitude. Determining the one or more properties of the RF signal 102 may also include assigning the reference phase and the reference amplitude to a target RF pulse in the time series of RF pulses based on the correlation value. In some instances, the reference RF pulse is associated with a reference symbol that is part of a plurality of symbols of a communication protocol. In these instances, determining the one or more properties of the RF signal 102 may include assigning the reference symbol to the target RF pulse based on the correlation value.

Figure 6:
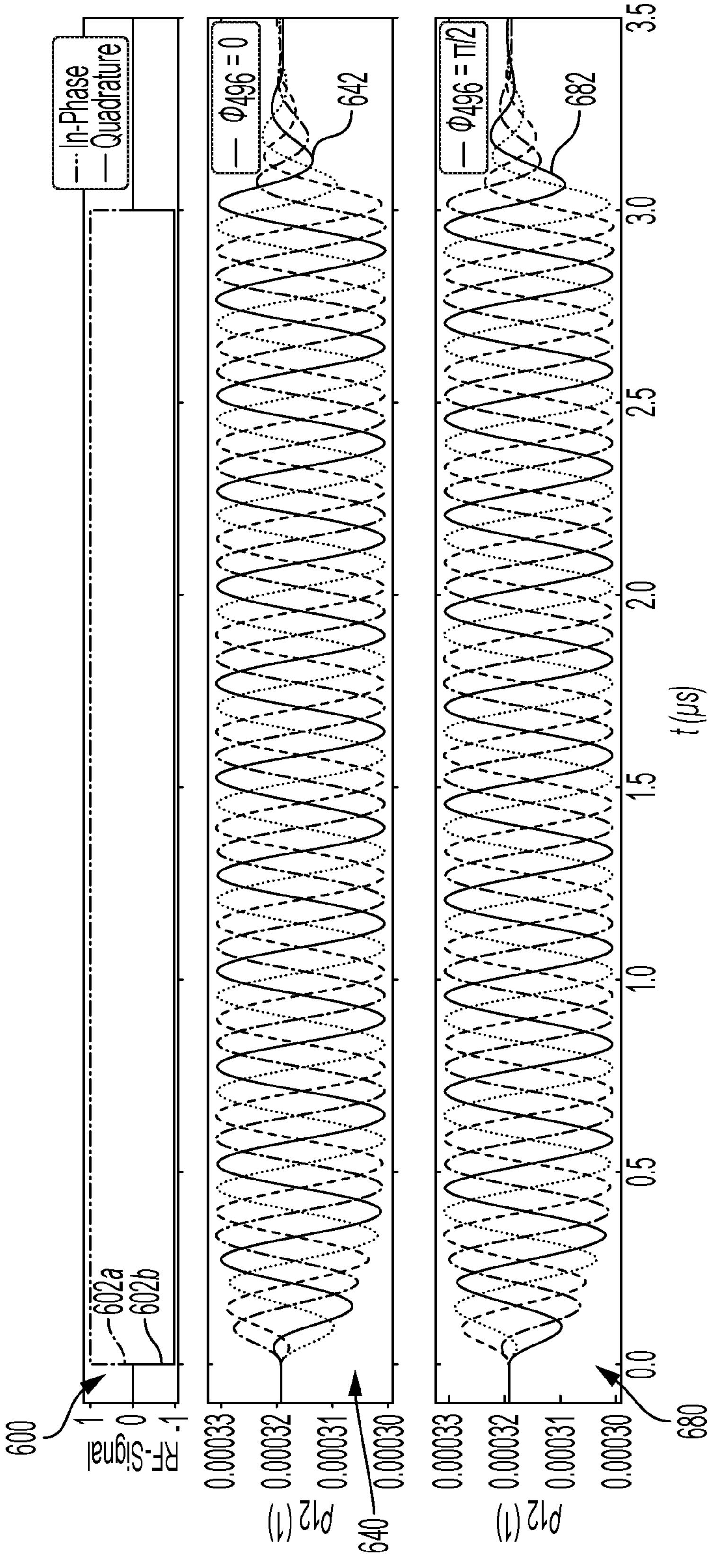
FIG. 6 is a series of graphs showing a third example readout of symbols encoded in an RF signal.

In some implementations, and similar to the second example method, a third example method includes operating one of the lasers at a detuned frequency relative to its optical transition. The RF signal can also be detuned. However, in these implementations, the phase of one of the laser signals is used to demodulate the I and Q signals. The third example method is similar to the second example method except that phase shifters are used to optically shift the phase of one of the laser signals into the I and Q modes, as shown in FIG. 6. The field of the shifted laser signal can be phase shifted using, for example, an electro-optic modulator or delay line. Electro-optic phase shifts can be advantageous as they can be fast (e.g., have bandwidths up to 100 GHz). The phase shifts can also be aligned using the same procedures as described in relation to the second example method. A response template (e.g., a matched filter) can be used to determine the incoming symbol as signals that are phase shifted from the accepted signal will give a low correlation value. The amplitude of the correlation is used to determine the amplitude of the signal. In many cases, the third example method is carried out with an I and a Q channel that are physically separated. This separation allows the atoms in the vapor to interact with a specific phase-shifted laser signal so that there is no interference between the I and the Q atomic interferometers. FIG. 6 presents an example of signals for the third example method. In certain cases, the amplitude information may become uncertain when using the third example method due to its use of optical demodulation. In contrast, the amplitude of the digital demodulation signal is known almost absolutely. The second example method described above relies on digital demodulation.

FIG. 6 presents a series of graphs 600, 640, 680 showing a third example readout of symbols encoded in an RF signal. The example readout may be performed using the example system 100 described in relation to FIG. 1 or the example system 300 described in relation to FIG. 3. In the upper graph 600 of FIG. 6, an in-phase (I) and quadrature (Q) symbol corresponding to respective components 602*a*, 602*b* of the RF signal are obtained in absorption for an in-phase shifted laser signal 642 at $\lambda$=496 nm and a quadrature shifted laser signal 682 at $\lambda$=496 nm. The dashed curves in the graphs 640, 680 show, respectively, the in-phase shifted and quadrature shifted laser signals 642 at various phase shifts, with the optimal phase shift represented by the solid line. The two signals 642, 682 are different and can be read-out by correlations with a response template (e.g., an expected matched filter). Moreover, the frequency of the oscillations can be used to determine the detuning of the RF signal, as described in relation to the second example method. The amplitude of each component corresponds to the amplitudes of the I and Q components, which are equal in this case. The phases can be aligned to the signal using standard communication protocols and RF equipment, such as that described in relation to the example systems 100, 300 of FIGS. 1 and 3.

The example systems 100, 300 of FIGS. 1-3 may be configured to perform the third example method. For example, the data processing system 122 of FIG. 1 may instruct the laser system 108 to detune the detuned loop laser signal relative to the first loop optical transition by a detuning frequency. The oscillation of the output optical signal 114 may then have an oscillation frequency that corresponds to the detuning frequency. In these cases, the signal processing system 120 may determine the one or more properties of the RF signal 102 by operations that include generating, based on the detector signal 118, oscillation data that represents an oscillation of the output optical signal 114 as the laser signals 110 and the RF signal 102 interact with the vapor 106 over time. The operations may also include generating quadrature data and in-phase data based on the oscillation data and determining the one or more properties of the RF signal 102 based on the quadrature and in-phase data. The one or more properties include the phase of the RF signal 102. However, other properties are possible, such an amplitude of the RF signal 102, a frequency of the RF signal 102, and so forth.

In some implementation, the loop laser signals 110*b* include a shifted loop laser signal that has a phase that is shifted relative to a reference phase. In these implementations, the oscillation data corresponds to the in-phase data when the phase of the shifted loop laser signal is at the reference phase and to the quadrature data when the phase of the shifted loop laser signal is shifted 90° relative to the reference phase. The reference phase may be derived from various sources, such as a synchronization signal, a clock signal, or a GPS signal. For example, the RF signal 102 may include a synchronization signal, and in these cases, the reference phase may be defined by the synchronization signal. As another example, the example system 100 may include a clock that generates a clock signal, and these latter cases, the reference phase may be defined by the clock signal. Other types of sources may be used to set or define the reference phase.

In some implementations, the number of measurements may be extended when using any one of the first through third example methods, whether individually or in some combination. For example, more phases or more frequencies can be used. In some cases, it may be advantageous to use more phases or more frequencies for redundancy or when a dense coding scheme is used, especially when correlations are used to decode an incoming RF signal. Electromagnetically induced absorption, electromagnetically induced transparency, or both can also be used for these measurements. Furthermore, other optical schemes can be used where the probe laser signal samples a closed loop of transitions. The interferometric loop can also use more laser signals or less if more than dipole-allowed transitions are utilized. In certain cases, an optimum scheme uses dipole-allowed transitions, and therefore the closed loop of transitions includes a minimum of three preparation laser signals (e.g., laser fields) and one RF signal (e.g., a target RF field).

Phase detection is important because phase and amplitude modulation are used for encoding information in RF communications and for radar pulse compression. Binary phase shift keying (BPSK) is a robust example of a communication protocol, where the amplitude of the wave is constant, but information is encoded using phase shifting by n. For more densely encoded signals, quadrature amplitude modulation (QAM) can be used. In 5G-NR communication, the synchronization signal that identifies beam and channel information uses BPSK encoding because it is robust. The synchronization signal can last 5 milliseconds and is followed by a variable, but about 15 millisecond window where a signal is encoded. The signal encoding is done using QAM. The fastest channel rate can be 240 kHz, with about 4.1 μs for the pulse period. Other radar and communications protocols are similar since they are based on RF technology.

Rydberg atom-based sensors are square law detectors in the steady state. In other words, they are insensitive to phase. However, this is not true for the example systems 100, 300 described in relation to FIGS. 1-6. A phase change of the target electromagnetic field can lead to a change in the interference phenomena that are used to dress the atom, namely, the closed interferometric loop shown in FIG. 2 and the left side 316 of FIG. 3A, so that it is simultaneously sensitive to the phase and amplitude of a target RF electromagnetic wave. When the phase or amplitude of the target RF electromagnetic wave changes (e.g., its electric field component changes), the transmission (or analogously the absorption) of the probe laser signal through the vapor will exhibit large changes, such as shown in FIG. 3B.

One method for measuring the strength of an RF field with a vapor of Rydberg atoms involves Autler-Townes splitting, where the presence of the RF field induces a resolvable energy splitting in the Rydberg electronic state. By monitoring spectra of the electromagnetically induced absorption (EIA) or electromagnetically induced transparency (EIT), the field strength can be determined from the observed splitting. Another method is amplitude-based detection, where the optical response of the atoms is used to track the intensity of the RF field. While both methods are highly effective for measuring field strength, they do not provide direct access to the phase of the RF signal, which is very useful for coherent signal processing and precision measurements. To address this limitation, heterodyne detection techniques have been developed, wherein two RF fields with a known relative phase are used to down-convert a signal to a lower frequency, thereby allowing phase-sensitive measurements. While effective, heterodyne detection techniques often require additional reference signals, precise frequency stabilization, and complex signal processing. An alternative and more intrinsic approach to phase detection can be realized through closed-loop excitation schemes in multi-level atomic systems, such as described in relation to FIGS. 1-3B.

The advantage of the all-optical phase detection is that it preserves all the unique properties of Rydberg atom-based vapor cell sensors, such as broad carrier bandwidth. These sensors are all-dielectric sensors that also include high electromagnetic transparency, passive sensing, and high immunity to electromagnetic interference. In many configurations, they also have a small size, weight, and power (SWaP) when compared to legacy RF equipment. The all-optical phase detection is also robust to atomic motion. In fact, in many cases, atomic motion helps to damp out transient oscillations that can otherwise complicate the phase readout. Likewise, collisions can also help to damp transient behavior.

A phase-sensitive RF detection scheme, such as described in relation to the example systems 100, 300 of FIGS. 1 and 3, can use a five-level Rydberg system. A vapor of cesium atoms can provide this five-level Rydberg system, which can be driven by four optical fields and an RF wave. Moreover, the Rydberg system forms a closed excitation loop that, when driven by the optical fields and the RF wave, can function as an interferometric loop. Furthermore, when operated under finite detuning of one of the lasers, the Rydberg system exhibits non-equilibrium dynamics that can encode the phase and amplitude of the RF field in the atomic response, such as shown in FIG. 2. The frequency of the target RF wave can be determined from the frequency of the oscillations. This detection scheme provides direct phase and amplitude discrimination without the need for external reference signals or heterodyne mixing. The detection scheme also preserves the all-dielectric nature of a vapor cell sensor (e.g., electromagnetic transparency of the sensor, which translates to its non-perturbing nature), the broad accessible carrier bandwidth, and the passive receive nature of the system. The detection scheme opens new avenues for quantum enhanced phase sensitive sensing, with implications for secure communications, radar applications, and next-generation RF signal processing for Rydberg atom sensors.

Phase shifting the laser signals can also enable the interferometric loop (e.g., an atomic interferometer) to 'align' with a specific RF phase. If there is a detuning, then there is a time dependent phase, Δt. The time-dependent phase results in an oscillating transmission of the probe laser signal, oscillating at the detuning frequency. The oscillating transmission (e.g., oscillating field) can be used to determine the frequency of the RF electromagnetic wave driving the RF transition if the detunings of the laser signals are known. If the oscillation frequency is different from the one expected for the detuning, then it is known that the RF electromagnetic wave is not at resonance. The shift in the frequency can be actively compensated by one of the laser signals to keep the 'set' oscillation frequency constant. Thus, if the detuning needed to maintain the 'set' oscillation frequency is known, then the target RF detuning can be determined because the compensating laser signal detuning is the one needed to cancel the effect of the off-resonance RF electromagnetic wave. Since the overall system generally provides an oscillating absorption signal, it can be fed into a digital or analog circuit and be demodulated. The demodulated signals obtained by mixing the incoming signal with other sinusoidal signals can be used to get I and Q values, such as shown in FIGS. 7A-7D. Correlations can also be used to decode the signals.

Figure 7A:
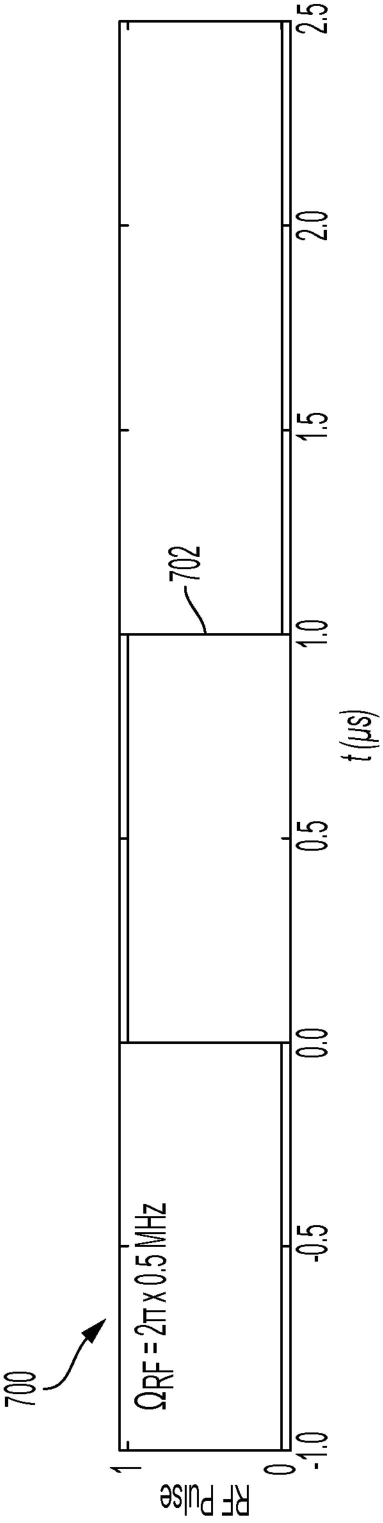
FIG. 7A is a graph showing an example RF pulse that provides the time-dependence of an amplitude change and a phase change.
Figure 7B:
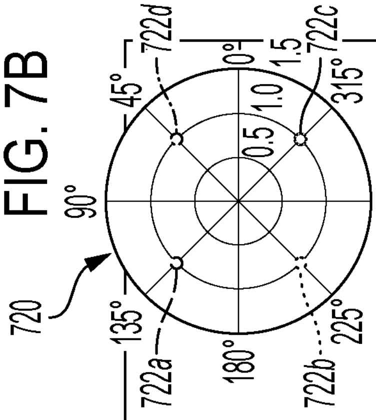
FIG. 7B is a polar graph showing I and Q values for the example RF pulse of FIG. 7A.
Figure 7C:
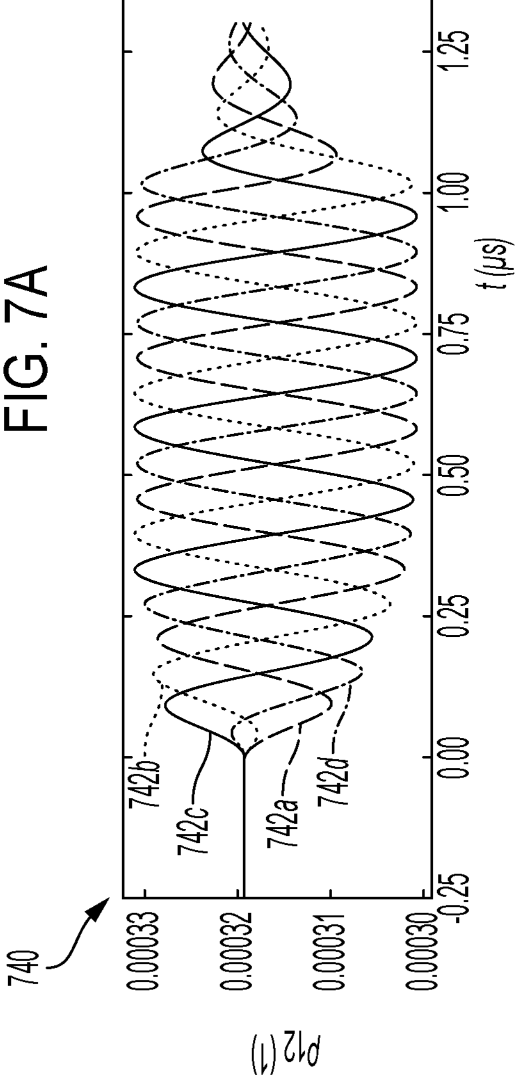
FIG. 7C is a graph showing an example of the absorption for each of the different symbols when the phases of the laser signals are set to zero.
Figure 7D:
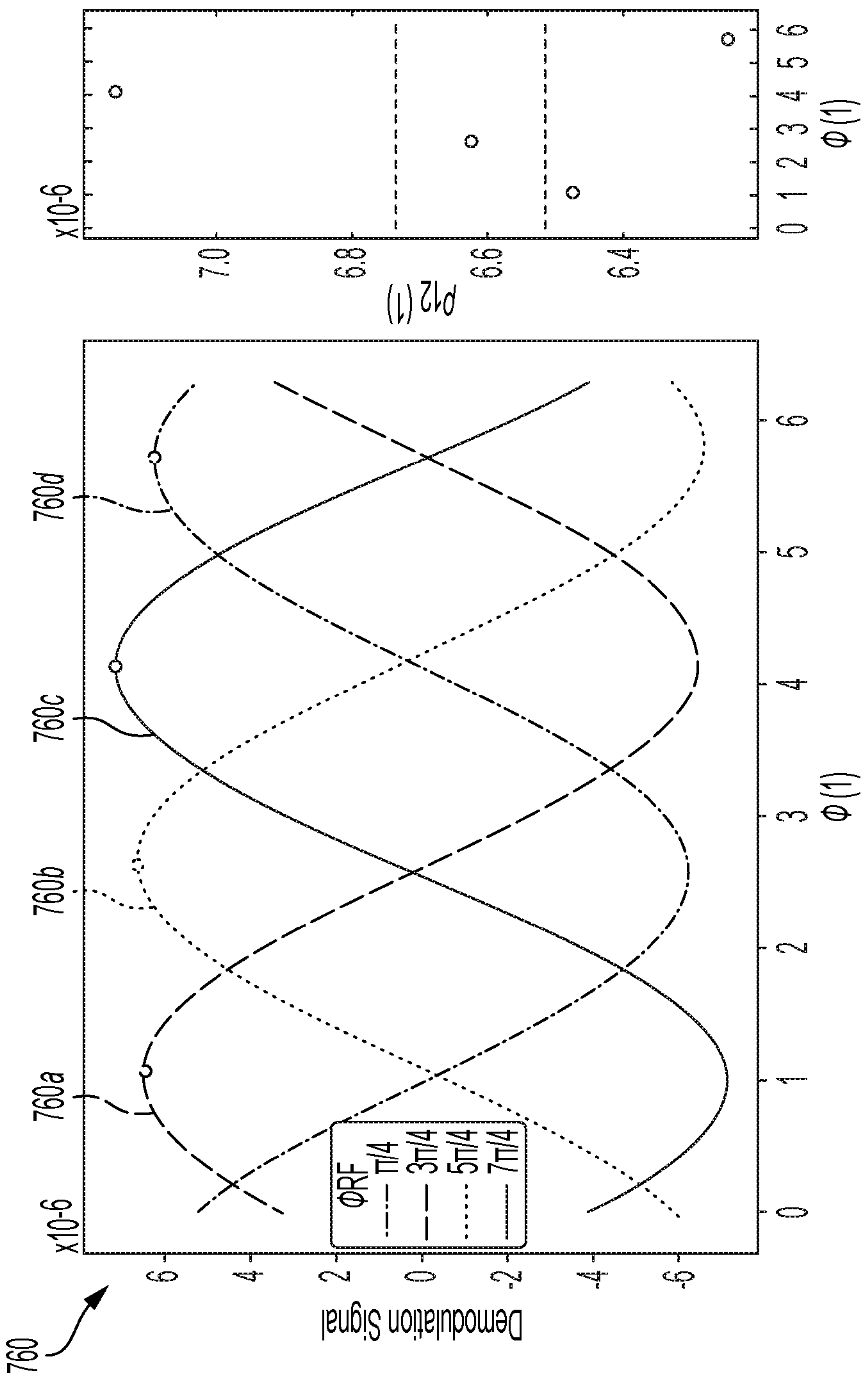
FIG. 7D is a graph showing the amplitude of an example signal that is demodulated at different phases of the demodulation signal.

FIG. 7A presents a graph 700 showing an example RF pulse 702 that provides the time-dependence of an amplitude change and a phase change. FIG. 7B presents a polar graph 720 showing I and Q values 722*a-d* for the example RF pulse of FIG. 7A. In FIG. 7B, I lies along the x-axis and Q lies along the y-axis nominally. The amplitude is the radius needed to reach a point in the polar graph 720 while the phase angle is the angle progressing from the x-axis in a right-handed manner. The four points 722*a-d* are applicable, for example, to the example systems 100, 300 described in relation to FIGS. 1 and 3 as well as the first through third example methods disclosed above. FIG. 7C presents a graph 740 showing an example of the absorption 742*a-d* for each of the different symbols when the phases of the laser signals are set to zero. The phase of the example RF pulse 702 manifests itself in the phase of the oscillations 742*a-d* while the amplitude manifests in the amplitude of the oscillations 742*a-d*. FIG. 7D presents a graph 760 showing the amplitude of an example signal 760 that is demodulated at different phases 760*a-d* of a demodulation signal. The graph 760 demonstrates that the symbols can be distinguished from each other.

In some implementations, a sensing system may be used to determine the phase of an RF signal. The sensing system is a Rydberg sensing system and may be analogous to the example systems 100, 300 described in relation to FIGS. 1 and 3. The sensing system includes a vapor cell, a laser system, and a signal processing system. The laser system is configured to generate at least four laser signals (e.g., a probe laser signal, a first loop laser signal, a second loop laser signal, etc.), and at least one laser signal is capable of being phase shifted and/or detuned. In some configurations, all the laser signals are capable of being phase-shifted and/or detuned. The sensing system may also include a frequency reference that assists the sensing system in measuring the detuning of one or more of the laser signals. The lasers signals may propagate through the vapor of the vapor cell sensor in a counter-propagating manner to cancel out phase shifts due to wave-vector mismatch. However, in some instances, the laser signals may co-propagate through the vapor.

During operation of the sensing system, the transmission of the probe laser signal through the vapor is detected by an optical detector system that converts the optical transmission of the probe laser signal into an electrical signal. The electrical signal can then be processed with analog electronics or digital electronics that are part of the signal processing system. Digital electronics provide advantages because it may be easier to apply response templates and demodulate the signal while preserving the amplitude information. For example, the electrical signal can be demodulated nominally with a sinusoidal signal that can be phase shifted. The demodulation signal can be referenced to a clock signal, or alternatively, acts itself as the phase reference. Once demodulated, and I and Q values (or analogous values) are determined, the resulting I and Q data can be recorded on a computing device. The computing device may include a field programmable gate array (FPGA), a central processing unit (CPU), or a graphics processing unit (GPU). Further operations can be performed on the computing device. In some instances, the sensing system includes a frequency comb for reading out the signals and/or for changing the RF tuning frequency.

In some implementations, the sensing system is configured to process communications and radar signals that are phase and amplitude encoded. One example is 5G-NR signals, especially the primary synchronization signals (PSS), secondary synchronization signals (SSS) and physical broadcast channel (PBCH). These signals can be used to evaluate base station performance and diagnose base station health. Another example is to decode the phase encoding of a radar signal to evaluate the return pulse and also obtain Doppler shift information. It is also possible to decode signals like global navigation satellite system (GNSS) signals. The optical phase sensing method and system may allow RF engineers to use Rydberg atom-based vapor cell sensors without having to interpret the optical signals.

In some implementations, the vapor cell is coupled via free-space or waveguide (e.g., fiber optic cable) to the laser system and the signal processing system. The vapor cell can also have a mounting system and can be virtually any type of vapor cell. For example, the vapor cell may be a metrology vapor cell. Metrology vapor cells are useful for test and measurement applications. As another example, the vapor cell may be a photonic crystal receiver. The photonic crystal receivers may be useful for radar applications, such as described in U.S. Pat. No. 11,137,487 entitled "Radar Systems Using Photonic Crystal Receivers to Detect Target Objects". The vapor cell includes a vapor of atoms whose electronic states have at least one Rydberg electronic state. The electronic states define a loop of electronic transitions that can function as an interferometric loop. As such, the vapor of atoms may allow the vapor cell to operate as an atomic interferometer. In some implementations, the loop of electronic transitions requires four laser signals to close a pathway along its loop (along with the RF signal). In certain cases, the closed loop of electronic transitions includes a dipole-allowed transition. The three-photon approach augmented by a laser signal at 496 nm, as shown in FIGS. 2 and 3A, provides an advantage as one pathway along the closed loop is Doppler free.

In some implementations, the laser system includes four lasers configured for Rydberg atom-based sensing, as shown in FIGS. 2 and 3A. An output optical signal from the vapor cell sensor can be generated using EIT or EIA. A sub-Doppler method can be useful for higher spectral resolution in the Autler-Townes regime and higher sensitivity. Doppler shifts can positively affect the response of the vapor, such as by damping out transient amplitude and phase responses. Engineering of the collisional dephasing rates can also damp the transient response upon amplitude or phase changes. The four lasers may be configured to produce a colinear three-photon readout method that also includes a 496-nm laser. The lasers can be locked to a stable, narrow bandwidth reference, such as a frequency comb, an interferometer, or an atomic or molecular absorption line. These locks can be offset locks or other types of locks that allow the detunings of the lasers to be measured and controlled. The lasers can also pass through devices that can phase shift the light, e.g. an electro-optic modulator.

To read out the signal, either the loop laser signal or the probe laser signal can be scanned, but such scanning does not provide a real-time readout and may be poorly suited for pulse detection. In many cases, a more suitable method is to keep the probe laser signal on-resonance and readout its time-dependent signal using a frequency comb on the probe laser signal to readout the oscillations at many probe laser frequencies. The probe laser signal can be read out in an optical heterodyne setup. A loop laser comb can be used to readout the signals at several detunings at the same time. The loop laser comb does not require many teeth, but in many instances, the number of teeth is not fixed. If a frequency comb is used for the probe laser signal, a real-time spectrum analyzer can be used to detect the probe laser signal by reading out the combined beat signals of the probe and loop laser combs. An electro-optic modulator can be used to introduce multiple frequencies of the loop laser signal with fixed detunings, e.g., fixed by an RF generator driving the loop laser comb. The loop laser signal of the EIT or EIA-like sensing system can be tuned to different Rydberg states to target different RF frequencies. Details of using a comb readout are further described in U.S. Pat. No. 11,658,461 entitled "Tuning the Output of a Laser".

In some implementations, the laser system may include a laser control subsystem. The light in the laser control subsystem, necessary for monitoring the lasers and keeping them stable, can be routed via waveguide through all or part of the sensing system. The light can be directed to the vapor cell in free-space or through optical fiber. Feedback to control the lasers, including feed forwards, can be realized using FPGAs, analog electronics, or another processor-based system that can be controlled through a user interface and through autonomous control layers operating in different types of processors. The agile laser system described in U.S. Pat. No. 11,658,461 can be advantageous in some cases. For example, RF signals that depend on correlated reception can be encoded on several different carrier frequencies in order to avoid interception. Only by decoding the signal from each carrier frequency can the signal be decoded.

In some implementations, the sensing system includes an optical detector (e.g., a photodetector) that is configured to detect the probe laser signal. The optical detector senses changes in the transmission through the vapor cell due to the field of the RF signal (e.g., the electric field of the RF signal). In certain cases, the signal from the optical detector is converted to a digital signal that can be processed on a FPGA, a GPU, a CPU, or some combination thereof. Specialized hybrid processors are also possible (e.g., an ASIC). In these cases, the signal processing system is configured to store the digital signal as a function of time and run it through one or more response templates to identify properties of the incoming, time dependent RF signal (e.g., periodicity, arrival time, etc.). The signal processing system is also configured to demodulate the incoming signals from the optical detector by multiplying them with a reference signal like a sinusoid to detect I and Q data, or similar type demodulations.

In some implementations, the sensing system is used with a reference signal. The reference signal can be internal to the sensing system, external to the sensing system, or carried on the RF signal wave. The signal processing system is capable of phase shifting the demodulation signals to align with the incoming encoded signals. The incoming encoded signals can be decoded digitally by running correlations with different phase shifted demodulation signals until the data conforms to a synchronization signal. The synchronization signal may be carried on the RF signal itself. Other types of references can be clocks that are synchronized to GPS time or an independent system that synchronizes the demodulation signal. The sensing system is also capable of detecting continuous wave RF signals and demodulating them into I and Q data. The RF signals can be averaged together over time or acquired in real-time. Moreover, the RF signal train can be subjected to additional analysis by the signal processing unit (e.g., an FPGA thereof). The resulting data is used to locate, measure, and decode incoming RF signals that vary in time and space. The resulting data can also be used to calculate parameters such as peak power, decode transmission information, and calculate derivative information based on the RF signal measurements. In some cases, the data is available, in whole or in part, to the user via the user interface. The digital signals can be stored in the sensing system (e.g., a computing device thereof) for future evaluation, in whole or in part. The calculated data can also be stored in the sensing system. The response templates (e.g., matched filters) can be tailored to the atomic response for optimum performance, but it is also possible to use simple filters like square pulse or transient pulse forms for matched filtering.

In some implementations, the sensing system includes a computing device with a user interface. The computing device may include a computer readable code that can be run on a processor and changed by the user via the user interface to control the laser system and signal processing system. The computing device may also run diagnostics to monitor the health of the sensing system. In certain cases, the computing device allows the sensing system to be an autonomous sensing system. In these cases, the autonomous sensing system interfaces with the user through the user interface, which may also allow the user to interact with and control the signal processing system.

In some implementations, the vapor cell can be a metrology vapor cell, a glass vapor cell, a MEMs vapor cell, or another type of engineered vapor cell based on metamaterial or photonic crystal principles. Multiple vapor cells are possible. The vapor cell can be encased in a thin electromagnetically transparent housing, such as one made from PLA plastic. The housing can accommodate a holder for the vapor cell and its waveguide. Several vapor cells addressed by different, detuned lasers are also possible. It is also possible that multiple sets of laser signal beams can pass through a single or multiple vapor cells.

In some implementations, the sensing system can be battery powered, plugged into wall power, or both. Battery operation may allow for remote field testing. However, some remote field testing may be compatible with power supplied by a generator, such as a vehicle engine running an alternator to charge a battery and supply DC power. In these cases, the system may be powered by a generator provided on-site at the remote field. In some variations, the sensing system includes a GPS receiver for positioning and a precision clock for timing and data fusion, or both. This configuration of the sensing system may be advantageous for applications such as over-the-air (OTA) field testing and radar.

In some implementations, the sensing system may be used to determine the phase of the RF signal according to a method, such as the first through third example methods described above. The method may allow other properties of the RF signal to be determined as well (e.g., amplitude, frequency, etc.). Additional examples of the method are described below. In these examples, the sensing system may include the components disclosed above (e.g., the vapor cell, the laser system, the signal processing system, etc.). However, the numbers and configurations of the components can differ, depending on the method used. For example, three vapor cells or two independent beam sets passing through a single vapor cell can be used. As another example, three vapor cells with different respective detunings might allow for better precision when detecting the phase.

In some implementations, the method is based on detuning of one of the lasers with reference on a leading edge of an RF pulse. In these implementations, the RF signal includes RF pulses that can repeat and may form a sequence of RF pulses. The RF signal also includes a synchronization signal. The method may be used with the example systems 100, 300 described in relation to FIGS. 1 and 3A or the example of the sensing system described above. For this method, a single vapor cell may be used. However, multiple vapor cells or multiple sets of laser signals passing through a single vapor cell are possible.

The method includes setting up the sensing system. The sensing system may include a vapor cell and its mount, a laser system, a signal processing system, and a computing device with a user interface. The method also includes detuning one of the laser signals by a known amount. The frequency of the detuning may correspond to the expected oscillation frequency of an incoming RF signal induced on a transmission signal.

The method may additionally include acquiring the target RF time-dependent pulse train, which may be modulated in one or both of phase and amplitude. The optical signal from the vapor cell is then received by the optical detector (e.g., a photodiode) and the resulting detector signal fed into an analog to digital converter that is communication with (or part of) the signal processing system. The resulting digital signal is replicated and the detuning of the laser signal adjusted to match the expected oscillation frequency. The detuning of the RF signal is then determined from the necessary additional laser detuning, and the frequency offset recorded. In many cases, the resulting digital signal is a digitized probe laser signal. A frequency of the digitized probe laser signal may be used to find the frequency (e.g., the transition) of the incoming RF signal. In some instances, a correlation with the oscillation frequency is undertaken to find the frequency of the incoming RF signal. In these cases, the probe laser signal can be replicated and sent through response templates to find correlations to set the detuning of the laser and/or determine the frequency of the incoming RF signal. The frequency of the oscillations can, in some instances, also be measured directly to determine how different the frequency of the oscillations is from how the interferometer was set up (e.g., by counting peaks or zero crossings to determine the frequency).

The method includes using the replicated digital signal in the signal processing system and multiplying it by a series of phase shifted sinusoidal reference signals. Different search algorithms can be used that consider prior trials. An I channel and a Q channel can be run with the sinusoidal reference signals 90 degrees out of phase with each other. The overall phase shifts to lock into the incoming RF signal will be identical for both reference signals. The incoming RF signal can manifest itself in the response of the probe laser transmission. The probe laser response is detected on a photodetector and digitized. Moreover, in many cases, the correlations and calculations used to obtain the information from the incoming RF signal can be determined by operations (e.g., digital signal processing) on the digitized signal.

The method also includes analyzing the multiplied output. When the phase is correct the synchronization signal will be detected. This phase is then used to determine the overall phase for the reference signals. The method additionally includes multiplying the incoming digital signals with the reference signals. Such multiplication will split each of the incoming digital signals into first and second portions. The first portion will correspond to I, and the second portion will correspond to Q. The output is then recorded as output data. The method additionally includes determining the symbols using the output data. Depending on the application, the output data and the symbols may be stored.

The preceding operations of the method may be repeated for each new RF signal or when a phase shift develops that makes it difficult to determine the synchronization symbols. The method may be used for BSPK detection or detection in some forms of radar detection.

In some implementations, the method is an IQ analog phase detection method. In these implementations, the reference will be in the sensing system (e.g., its FPGA clock). The method may be used with the example systems 100, 300 described in relation to FIGS. 1 and 3A or the example of the sensing system described above. For this method, one or more vapor cells may be used.

The method includes setting up the sensing system. The sensing system may include a vapor cell and its mount, a laser system, a signal processing system, and a computing device with a user interface. The method also includes detuning one of the laser signals by a known amount. The frequency of the detuning may correspond to the expected oscillation frequency of an incoming RF signal induced on the transmission signal.

The method may additionally include acquiring the target RF time-dependent pulse train, which may be modulated in one or both of phase and amplitude. The output optical signal from the vapor cell is then received by the optical detector (e.g., a photodiode) and the resulting detector signal fed into an analog to digital converter that is communication with (or part of) the signal processing system. The resulting digital signal is replicated and the detuning of the laser signal adjusted to match the expected oscillation frequency. The digital signal that is replicated may be a digitized probe laser signal. The detuning of the RF signal is then determined from the necessary additional laser detuning, and the frequency offset recorded.

The method includes using the replicated digital signal in the signal processing system and multiplying it by a sinusoidal signal that is a cosine of the oscillation frequency with its zero time at the start of the incoming signal. This operation will generate I data. The method also includes using the replicated digital signal in the signal processing system and multiplying it by a sinusoidal signal that is a sine of the oscillation frequency with its zero time at the start of the incoming signal. This operation will generate Q data. The method additionally includes recording the I and Q data as a function of time and storing the output as output data.

In certain cases, the method may be used for IQ detection in radar and communications applications.

In some implementations, a process may be used to determine one or more properties of a RF signal, such as a phase of the RF signal, an amplitude of the RF signal, a frequency of the RF signal, and so forth. The RF signal may be based on a pulsed or continuous RF field. The process may be used with the example systems 100, 300 described in relation to FIGS. 1 and 3A or the example of the sensing system described above. Moreover, in certain cases, the process may include the methods described above.

Figure 8:
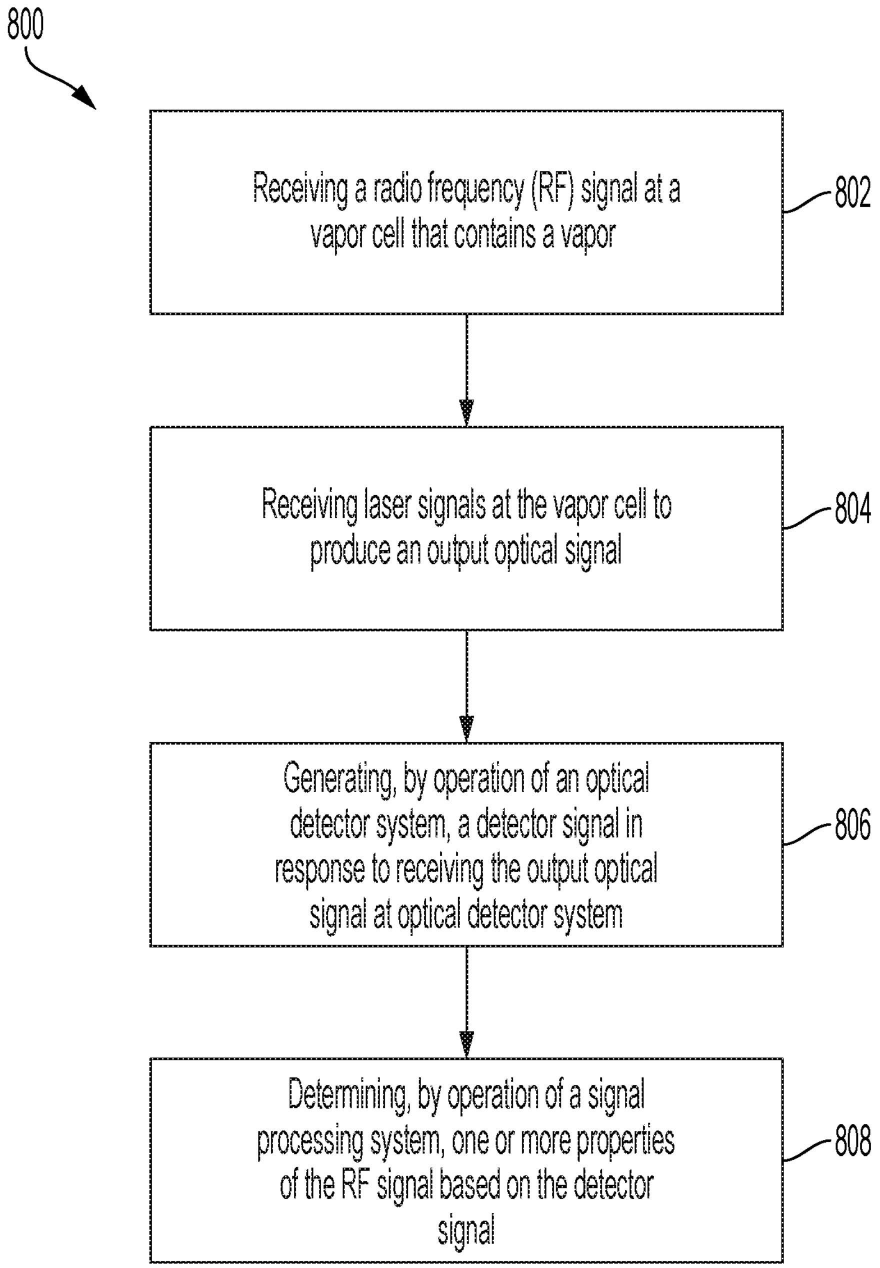
FIG. 8 is a flowchart of an example process for determining one or more properties of an RF signal.

FIG. 8 presents a flowchart of an example process 800 for determining one or more properties of an RF signal. As shown in block 802, the method 800 includes receiving a RF signal at a vapor cell that contains a vapor. The vapor defines an RF transition that is driven by the RF signal. The vapor also defines a set of loop optical transitions and a probe optical transition. The set of loop optical transitions, together with the RF transition, forms a closed loop of transitions. Moreover, the set of loop optical transitions includes a first loop optical transition that shares an energy level with the probe optical transition. The method 800 also includes receiving laser signals at the vapor cell to produce an output optical signal, as shown by block 804. The laser signals include loop laser signals that drive the set of loop optical transitions. For example, individual loop laser signals may drive respective ones of the loop optical transitions. The probe laser signal also drives the probe optical transition to produce the output optical signal. Moreover, the loop laser signals include a detuned loop laser signal that drives, and is detuned relative to, the first loop optical transition.

As shown by block 806, the method 800 additionally includes generating, by operation of an optical detector system, a detector signal in response to receiving the output optical signal at the optical detector system. The method 800 also includes determining, by operation of a signal processing system, one or more properties of the RF signal based on the detector signal, as shown by block 808. The signal processing system is in communication with the optical detector system.

In some implementations, determining the one or more properties of the RF signal includes generating, based on the detector signal, oscillation data that represents an oscillation of the output optical signal as the laser signals and the RF signal interact with the vapor over time. The oscillations may be induced by detuning one or more of loop laser signals relative to their respective loop optical transitions and/or the RF signal relative to the RF transition. Determining the one or more properties of the RF signal may also include determining the one or more properties of the RF signal based on the oscillation data. The one or more properties may include a phase of the RF signal, an amplitude of the RF signal, a frequency of the RF signal, or some other property of the RF signal (e.g., a polarization). Combinations of properties are also possible (e.g., a phase and an amplitude of the RF signal). In many cases, the one or more properties include a phase of the RF signal. In some instances, determining the one or more properties include generating quadrature data and in-phase data based on the oscillation data. In these instances, the one or more properties of the RF signal may be determined based on the quadrature and in-phase data.

In some implementations, the example method 800 may be used to determine the properties of RF pulses. For example, the RF signal may include a time series of RF pulses, and the oscillation data may be generated over time. In these cases, determining the one or more properties of the RF signal may include comparing the oscillation data with a response template to generate a correlation value and assigning the reference phase and the reference amplitude to a target RF pulse in the time series of RF pulses based on the correlation value. Here, the response template represents a known response of the vapor to a reference RF pulse having a reference phase and a reference amplitude. In certain cases, the reference RF pulse is associated with a reference symbol that is part of a plurality of symbols of a communication protocol. As such, determining the one or more properties of the RF signal may include assigning the reference symbol to the target RF pulse based on the correlation value.

In some implementations, such as those in which quadrature data and in-phase data are generated based on the oscillation data, the loop laser signals may include a shifted loop laser signal having a phase that is shifted relative to a reference phase. In these cases, the oscillation data corresponds to the in-phase data when the phase of the shifted loop laser signal is at the reference phase and to the quadrature data when the phase of the shifted loop laser signal is shifted 90° relative to the reference phase. The reference phase may be derived from various sources, such as a synchronization signal, a clock signal, or a GPS signal. For example, the RF signal may include a synchronization signal, and in these cases, the reference phase may be defined by the synchronization signal. As another example, the example method 800 may include generating a clock signal by operation of a clock. In these latter cases, the reference phase may be defined by the clock signal. Other types of sources may be used to set or define the reference phase.

In some aspects of what is described, a system may be described by the following examples. The system is configured to determine the properties of an RF field in regions of space, such as a radiating near-field region and a far-field region. The RF field may be produced by an RF source (e.g., an RF antenna), and the properties of the RF field may include intensities and phases. In some implementations, the system is configured to determine an emission pattern of the RF source.

Example 1. A system, comprising:
- a vapor cell configured to receive a radio frequency (RF) signal and containing a vapor that defines:
  - an RF transition driven by the RF signal,
  - a set of loop optical transitions that, together with the RF transition, form a closed loop of transitions, the set of loop optical transitions comprising a first loop optical transition, and
  - a probe optical transition that shares an energy level with the first loop optical transition;
- a laser system configured to generate laser signals that comprise:
  - loop laser signals that drive the set of loop optical transitions, the loop laser signals comprising a detuned loop laser signal that drives, and is detuned relative to, the first loop optical transition, and
  - a probe laser signal that drives the probe optical transition and produces an output optical signal from the vapor cell;
- an optical detector system configured to generate a detector signal based on the output optical signal; and
- a signal processing system configured to determine one or more properties of the RF signal based on the detector signal.

Example 2. The system of example 1, wherein the signal processing system is configured to determine the one or more properties of the RF signal by operations that comprise:
- generating, based on the detector signal, oscillation data that represents an oscillation of the output optical signal as the laser signals and the RF signal interact with the vapor over time; and
- determining the one or more properties of the RF signal based on the oscillation data, the one or more properties comprising a phase of the RF signal.

Example 3. The system of example 2, wherein the one or more properties comprise an amplitude of the RF signal.

Example 4. The system of example 2 or example 3,
- wherein the detuned loop laser signal is detuned relative to the first loop optical transition by a detuning frequency; and
- wherein the oscillation of the output optical signal has an oscillation frequency that corresponds to the detuning frequency.

Example 5. The system of any one of examples 2-4,
- wherein the RF signal comprises a time series of RF pulses, and the oscillation data is generated over time; and
- wherein determining the one or more properties of the RF signal comprises:
  - comparing the oscillation data with a response template to generate a correlation value, the response template representing a known response of the vapor to a reference RF pulse having a reference phase and a reference amplitude, and
  - assigning the reference phase and the reference amplitude to a target RF pulse in the time series of RF pulses based on the correlation value.

Example 6. The system of example 5,
- wherein the reference RF pulse is associated with a reference symbol that is part of a plurality of symbols of a communication protocol; and
- wherein determining the one or more properties of the RF signal comprises assigning the reference symbol to the target RF pulse based on the correlation value.

Example 7. The system of example 1, wherein the signal processing system is configured to determine the one or more properties of the RF signal by operations that comprise:
- generating, based on the detector signal, oscillation data that represents an oscillation of the output optical signal as the laser signals and the RF signal interact with the vapor over time;
- generating quadrature data and in-phase data based on the oscillation data; and
- determining the one or more properties of the RF signal based on the quadrature and in-phase data, the one or more properties comprising a phase of the RF signal.

Example 8. The system of example 7, wherein the one or more properties comprise an amplitude of the RF signal.

Example 9. The system of example 7 or example 8, wherein:
- the loop laser signals comprise a shifted loop laser signal having a phase that is shifted relative to a reference phase; and
- the oscillation data corresponds to the in-phase data when the phase of the shifted loop laser signal is at the reference phase and to the quadrature data when the phase of the shifted loop laser signal is shifted 90° relative to the reference phase.

Example 10. The system of example 9, wherein the RF signal comprises a synchronization signal, and the reference phase is defined by the synchronization signal.

Example 11. The system of example 9, wherein system comprises a clock that generates a clock signal, and the reference phase is defined by the clock signal.

Example 12. The system of example 9, wherein the reference phase is defined by a global positioning satellite (GPS) signal.

Example 13. The system of any one of examples 1-12, wherein:
- the RF signal has a frequency that is detuned relative to the RF transition; and
- the one or more properties of the RF signal comprises the frequency of the RF signal.

Example 14. The system of any one of examples 1-13, wherein the laser system is configured to generate a first frequency comb that defines the probe laser signal, the first frequency comb comprising first comb laser signals at respective laser frequencies, at least one of the first comb laser signals being on resonance with the probe optical transition.

Example 15. The system of any one of examples 1-14, wherein the laser system is configured to generate a second frequency comb that defines the detuned loop laser signal, the second frequency comb comprising second comb laser signals at respective laser frequencies that are detuned relative to the first loop optical transition.

Example 16. The system of any one of examples 1-15, wherein the loop and probe laser signals propagate through the vapor along a common optical pathway and in a common direction.

Example 17. The system of any one of examples 1-15, wherein the loop and probe laser signals propagate through the vapor along a common optical pathway, the probe laser signal propagating in a direction opposite that of the loop laser signals.

Example 18. The system of any one of examples 1-17, wherein the closed loop of transitions comprises first and second loop segments that each extend between a common pair of energy levels.

Example 19. The system of example 18, wherein the first loop segment comprises the first loop optical transition, and the second loop segment comprises the RF transition.

Example 20. The system of example 18, wherein the first loop segment comprises the first loop optical transition and the RF transition.

Example 21. The system of any one of examples 18-20, wherein the common pair of energy levels corresponds to an uppermost energy level of the closed loop of transitions and a lowermost energy level of the closed loop of transitions; and wherein the energy level shared by the probe and first loop optical transitions is defined by the lowermost energy level of the closed loop of transitions.

In some aspects of what is described, a method may be described by the following examples. The method may be used to determine the properties of an RF field in regions of space, such as a radiating near-field region and a far-field region. The RF field may be produced by an RF source (e.g., an RF antenna), and the properties of the RF field may include intensities and phases. In some instances, the method is used to determine an emission pattern of the RF source.

Example 22. A method, comprising:

receiving a radio frequency (RF) signal at a vapor cell that contains a vapor, the vapor defining:

an RF transition driven by the RF signal, a set of loop optical transitions that, together with the RF transition, form a closed loop of transitions, the set of loop optical transitions comprising a first loop optical transition, and a probe optical transition that shares an energy level with the first loop optical transition;

receiving laser signals at the vapor cell to produce an output optical signal, the laser signals generated by a laser system and comprising:

loop laser signals that drive the set of loop optical transitions, the loop laser signals comprising a detuned loop laser signal that drives, and is detuned relative to, the first loop optical transition, and a probe laser signal that drives the probe optical transition and produces the output optical signal;

generating, by operation of an optical detector system, a detector signal in response to receiving the output optical signal at the optical detector system; and determining, by operation of a signal processing system, one or more properties of the RF signal based on the detector signal, the signal processing system in communication with the optical detector system.

Example 23. The method of example 22, wherein determining the one or more properties of the RF signal comprises:

generating, based on the detector signal, oscillation data that represents an oscillation of the output optical signal as the laser signals and the RF signal interact with the vapor over time; and determining the one or more properties of the RF signal based on the oscillation data, the one or more properties comprising a phase of the RF signal.

Example 24. The method of example 23, wherein the one or more properties comprise an amplitude of the RF signal.

Example 25. The method of example 23 or example 24, wherein the detuned loop laser signal is detuned relative to the first loop optical transition by a detuning frequency; and wherein the oscillation of the output optical signal has an oscillation frequency that corresponds to the detuning frequency.

Example 26. The method of any one of examples 23-25, wherein the RF signal comprises a time series of RF pulses, and the oscillation data is generated over time; and wherein determining the one or more properties of the RF signal comprises:

comparing the oscillation data with a response template to generate a correlation value, the response template representing a known response of the vapor to a reference RF pulse having a reference phase and a reference amplitude, and assigning the reference phase and the reference amplitude to a target RF pulse in the time series of RF pulses based on the correlation value.

Example 27. The method of example 26, wherein the reference RF pulse is associated with a reference symbol that is part of a plurality of symbols of a communication protocol; and wherein determining the one or more properties of the RF signal comprises assigning the reference symbol to the target RF pulse based on the correlation value.

Example 28. The method of example 22, wherein determining the one or more properties of the RF signal comprises:

generating, based on the detector signal, oscillation data that represents an oscillation of the output optical signal as the laser signals and the RF signal interact with the vapor over time;

generating quadrature data and in-phase data based on the oscillation data; and determining the one or more properties of the RF signal based on the quadrature and in-phase data, the one or more properties comprising a phase of the RF signal.

Example 29. The method of example 28, wherein the one or more properties comprise an amplitude of the RF signal.

Example 30. The method of example 28 or example 29, wherein:

the loop laser signals comprise a shifted loop laser signal having a phase that is shifted relative to a reference phase; and the oscillation data corresponds to the in-phase data when the phase of the shifted loop laser signal is at the reference phase and to the quadrature data when the phase of the shifted loop laser signal is shifted 90° relative to the reference phase.

Example 31. The method of example 30, wherein the RF signal comprises a synchronization signal, and the reference phase is defined by the synchronization signal.

Example 32. The method of example 30, comprising generating a clock signal by operation of a clock, the reference phase defined by the clock signal.

Example 33. The method of example 30, wherein the reference phase is defined by a global positioning satellite (GPS) signal.

Example 34. The method of any one of examples 22-33, wherein:

the RF signal has a frequency that is detuned relative to the RF transition; and the one or more properties of the RF signal comprises the frequency of the RF signal.

Example 35. The method of any one of examples 22-34, comprising:

generating, by operation of the laser system, a first frequency comb that defines the probe laser signal, the first frequency comb comprising first comb laser signals at respective laser frequencies, at least one of the first comb laser signals being on resonance with the probe optical transition.

Example 36. The method of any one of examples 22-35, comprising:

generating, by operation of the laser system, a second frequency comb that defines the detuned loop laser signal, the second frequency comb comprising second comb laser signals at respective laser frequencies that are detuned relative to the first loop optical transition.

Example 37. The method of any one of examples 22-36, wherein receiving laser signals at the vapor cell comprises propagating the loop and probe laser signals through the vapor along a common optical pathway and in a common direction.

Example 38. The method of any one of examples 22-36, wherein receiving laser signals at the vapor cell comprises propagating the loop and probe laser signals through the vapor along a common optical pathway, the probe laser signal propagating in a direction opposite that of the loop laser signals.

Example 39. The method of any one of examples 22-38, wherein the closed loop of transitions comprises first and second loop segments that each extend between a common pair of energy levels.

Example 40. The method of example 39, wherein the first loop segment comprises the first loop optical transition, and the second loop segment comprises the RF transition.

Example 41. The method of example 39, wherein the first loop segment comprises the first loop optical transition and the RF transition.

Example 42. The method of any one of examples 39-41, wherein the common pair of energy levels corresponds to an uppermost energy level of the closed loop of transitions and a lowermost energy level of the closed loop of transitions; and wherein the energy level shared by the probe and first loop optical transitions is defined by the lowermost energy level of the closed loop of transitions.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A system, comprising:

a vapor cell configured to receive a radio frequency (RF) signal and containing a vapor that defines:

an RF transition driven by the RF signal, a set of loop optical transitions that, together with the RF transition, form a closed loop of transitions, the set of loop optical transitions comprising a first loop optical transition, and a probe optical transition that shares an energy level with the first loop optical transition;

a laser system configured to generate laser signals that comprise:

loop laser signals that drive the set of loop optical transitions, the loop laser signals comprising a detuned loop laser signal that drives, and is detuned relative to, the first loop optical transition, and a probe laser signal that drives the probe optical transition and produces an output optical signal from the vapor cell;

an optical detector system configured to generate a detector signal based on the output optical signal; and a signal processing system configured to determine one or more properties of the RF signal based on the detector signal.

2. The system of claim 1, wherein the signal processing system is configured to determine the one or more properties of the RF signal by operations that comprise:

generating, based on the detector signal, oscillation data that represents an oscillation of the output optical signal as the laser signals and the RF signal interact with the vapor over time; and determining the one or more properties of the RF signal based on the oscillation data, the one or more properties comprising a phase of the RF signal.

3. The system of claim 2, wherein the one or more properties comprise an amplitude of the RF signal.

4. The system of claim 2, wherein the detuned loop laser signal is detuned relative to the first loop optical transition by a detuning frequency; and wherein the oscillation of the output optical signal has an oscillation frequency that corresponds to the detuning frequency.

5. The system of claim 2, wherein the RF signal comprises a time series of RF pulses, and the oscillation data is generated over time; and wherein determining the one or more properties of the RF signal comprises:

comparing the oscillation data with a response template to generate a correlation value, the response template representing a known response of the vapor to a reference RF pulse having a reference phase and a reference amplitude, and assigning the reference phase and the reference amplitude to a target RF pulse in the time series of RF pulses based on the correlation value.

6. The system of claim 5, wherein the reference RF pulse is associated with a reference symbol that is part of a plurality of symbols of a communication protocol; and wherein determining the one or more properties of the RF signal comprises assigning the reference symbol to the target RF pulse based on the correlation value.

7. The system of claim 1, wherein the signal processing system is configured to determine the one or more properties of the RF signal by operations that comprise:

generating, based on the detector signal, oscillation data that represents an oscillation of the output optical signal as the laser signals and the RF signal interact with the vapor over time;

generating quadrature data and in-phase data based on the oscillation data; and determining the one or more properties of the RF signal based on the quadrature and in-phase data, the one or more properties comprising a phase of the RF signal.

8. The system of claim 7, wherein the one or more properties comprise an amplitude of the RF signal.

9. The system of claim 7, wherein:

the loop laser signals comprise a shifted loop laser signal having a phase that is shifted relative to a reference phase; and the oscillation data corresponds to the in-phase data when the phase of the shifted loop laser signal is at the reference phase and to the quadrature data when the phase of the shifted loop laser signal is shifted 90° relative to the reference phase.

10. The system of claim 1, wherein:

the RF signal has a frequency that is detuned relative to the RF transition; and the one or more properties of the RF signal comprises the frequency of the RF signal.

11. The system of claim 1, wherein the laser system is configured to generate a first frequency comb that defines the probe laser signal, the first frequency comb comprising first comb laser signals at respective laser frequencies, at least one of the first comb laser signals being on resonance with the probe optical transition.

12. The system of claim 1, wherein the laser system is configured to generate a second frequency comb that defines the detuned loop laser signal, the second frequency comb comprising second comb laser signals at respective laser frequencies that are detuned relative to the first loop optical transition.

13. The system of claim 1, wherein the loop and probe laser signals propagate through the vapor along a common optical pathway, the probe laser signal propagating in a direction opposite that of the loop laser signals.

14. The system of claim 1, wherein the closed loop of transitions comprises first and second loop segments that each extend between a common pair of energy levels; and wherein the first loop segment comprises the first loop optical transition, and the second loop segment comprises the RF transition.

15. The system of claim 14, wherein the common pair of energy levels corresponds to an uppermost energy level of the closed loop of transitions and a lowermost energy level of the closed loop of transitions; and wherein the energy level shared by the probe and first loop optical transitions is defined by the lowermost energy level of the closed loop of transitions.

16. A method, comprising:

receiving a radio frequency (RF) signal at a vapor cell that contains a vapor, the vapor defining:

an RF transition driven by the RF signal, a set of loop optical transitions that, together with the RF transition, form a closed loop of transitions, the set of loop optical transitions comprising a first loop optical transition, and a probe optical transition that shares an energy level with the first loop optical transition;

receiving laser signals at the vapor cell to produce an output optical signal, the laser signals generated by a laser system and comprising:

loop laser signals that drive the set of loop optical transitions, the loop laser signals comprising a detuned loop laser signal that drives, and is detuned relative to, the first loop optical transition, and a probe laser signal that drives the probe optical transition and produces the output optical signal;

generating, by operation of an optical detector system, a detector signal in response to receiving the output optical signal at the optical detector system; and determining, by operation of a signal processing system, one or more properties of the RF signal based on the detector signal, the signal processing system in communication with the optical detector system.

17. The method of claim 16, wherein determining the one or more properties of the RF signal comprises:

generating, based on the detector signal, oscillation data that represents an oscillation of the output optical signal as the laser signals and the RF signal interact with the vapor over time; and determining the one or more properties of the RF signal based on the oscillation data, the one or more properties comprising a phase of the RF signal.

18. The method of claim 17, wherein the one or more properties comprise an amplitude of the RF signal.

19. The method of claim 17, wherein the detuned loop laser signal is detuned relative to the first loop optical transition by a detuning frequency; and wherein the oscillation of the output optical signal has an oscillation frequency that corresponds to the detuning frequency.

20. The method of claim 17, wherein the RF signal comprises a time series of RF pulses, and the oscillation data is generated over time; and wherein determining the one or more properties of the RF signal comprises:

comparing the oscillation data with a response template to generate a correlation value, the response template representing a known response of the vapor to a reference RF pulse having a reference phase and a reference amplitude, and assigning the reference phase and the reference amplitude to a target RF pulse in the time series of RF pulses based on the correlation value.

21. The method of claim 20, wherein the reference RF pulse is associated with a reference symbol that is part of a plurality of symbols of a communication protocol; and wherein determining the one or more properties of the RF signal comprises assigning the reference symbol to the target RF pulse based on the correlation value.

22. The method of claim 16, wherein determining the one or more properties of the RF signal comprises:

generating, based on the detector signal, oscillation data that represents an oscillation of the output optical signal as the laser signals and the RF signal interact with the vapor over time;

generating quadrature data and in-phase data based on the oscillation data; and determining the one or more properties of the RF signal based on the quadrature and in-phase data, the one or more properties comprising a phase of the RF signal.

23. The method of claim 22, wherein the one or more properties comprise an amplitude of the RF signal.

24. The method of claim 22, wherein:

the loop laser signals comprise a shifted loop laser signal having a phase that is shifted relative to a reference phase; and the oscillation data corresponds to the in-phase data when the phase of the shifted loop laser signal is at the reference phase and to the quadrature data when the phase of the shifted loop laser signal is shifted 90° relative to the reference phase.

25. The method of claim 16, wherein:

the RF signal has a frequency that is detuned relative to the RF transition; and the one or more properties of the RF signal comprises the frequency of the RF signal.

26. The method of claim 16, comprising:

generating, by operation of the laser system, a first frequency comb that defines the probe laser signal, the first frequency comb comprising first comb laser signals at respective laser frequencies, at least one of the first comb laser signals being on resonance with the probe optical transition.

27. The method of claim 16, comprising:

generating, by operation of the laser system, a second frequency comb that defines the detuned loop laser signal, the second frequency comb comprising second comb laser signals at respective laser frequencies that are detuned relative to the first loop optical transition.

28. The method of claim 16, wherein receiving laser signals at the vapor cell comprises propagating the loop and probe laser signals through the vapor along a common optical pathway, the probe laser signal propagating in a direction opposite that of the loop laser signals.

29. The method of claim 16, wherein the closed loop of transitions comprises first and second loop segments that each extend between a common pair of energy levels; and wherein the first loop segment comprises the first loop optical transition, and the second loop segment comprises the RF transition.

30. The method of claim 29, wherein the common pair of energy levels corresponds to an uppermost energy level of the closed loop of transitions and a lowermost energy level of the closed loop of transitions; and wherein the energy level shared by the probe and first loop optical transitions is defined by the lowermost energy level of the closed loop of transitions.

* * * * *